United States Patent
McJimsey et al.

(10) Patent No.: US 9,141,123 B2
(45) Date of Patent: Sep. 22, 2015

(54) MAXIMUM POWER POINT TRACKING CONTROLLERS AND ASSOCIATED SYSTEMS AND METHODS

(71) Applicant: Volterra Semiconductor Corporation, Fremont, CA (US)

(72) Inventors: Michael D. McJimsey, Danville, CA (US); Anthony J. Stratakos, Kentfield, CA (US); Ilija Jergovic, Palo Alto, CA (US); Xin Zhang, San Jose, CA (US); Kaiwei Yao, San Jose, CA (US); Vincent W. Ng, Milpitas, CA (US); Phong T. Nguyen, Pleasanton, CA (US); Artin Der Minassians, Oakland, CA (US)

(73) Assignee: Volterra Semiconductor LLC, San Jose, CA (US)

( * ) Notice: Subject to any disclaimer, the term of this patent is extended or adjusted under 35 U.S.C. 154(b) by 262 days.

(21) Appl. No.: 13/653,381

(22) Filed: Oct. 16, 2012

(65) Prior Publication Data
US 2014/0103894 A1    Apr. 17, 2014

(51) Int. Cl.
*G05F 1/00* (2006.01)
*G05F 1/67* (2006.01)
*H03K 3/356* (2006.01)
*H02J 3/38* (2006.01)

(52) U.S. Cl.
CPC . *G05F 1/67* (2013.01); *H02J 3/385* (2013.01); *H03K 3/356165* (2013.01); *Y02E 10/58* (2013.01)

(58) Field of Classification Search
USPC .......................... 323/207, 222, 271, 282–285
See application file for complete search history.

(56) References Cited

U.S. PATENT DOCUMENTS

| 4,649,334 | A |   | 3/1987 | Nakajima |
| 5,604,430 | A | * | 2/1997 | Decker et al. ................. 323/275 |
| 5,949,226 | A | * | 9/1999 | Tanaka et al. ................. 323/285 |
| 6,020,729 | A |   | 2/2000 | Stratakos et al. |
| 6,074,082 | A |   | 6/2000 | Gilbert |

(Continued)

FOREIGN PATENT DOCUMENTS

| JP | H11103538   | 4/1999 |
| JP | 2000112545  | 4/2000 |

(Continued)

OTHER PUBLICATIONS

Al-Atrash, H., "Analysis and Design of a Modular Solar-Fed Fault-Tolerant Power System with Maximum Power Tracking," 2005, 144 pages.

(Continued)

*Primary Examiner* — Nguyen Tran
(74) *Attorney, Agent, or Firm* — Lathrop & Gage LLP

(57) ABSTRACT

A maximum power point tracking controller includes an input port for electrically coupling to an electric power source, an output port for electrically coupling to a load, a control switching device, and a control subsystem. The control switching device is adapted to repeatedly switch between its conductive and non-conductive states to transfer power from the input port to the output port. The control subsystem is adapted to control switching of the control switching device to regulate a voltage across the input port, based at least in part on a signal representing current flowing out of the output port, to maximize a signal representing power out of the output port.

51 Claims, 8 Drawing Sheets

(56) References Cited

U.S. PATENT DOCUMENTS

| | | | |
|---|---|---|---|
| 6,160,441 | A | 12/2000 | Stratakos et al. |
| 6,225,795 | B1 | 5/2001 | Stratakos et al. |
| 6,262,558 | B1 | 7/2001 | Weinberg |
| 6,362,986 | B1 | 3/2002 | Schultz et al. |
| 6,445,244 | B1 | 9/2002 | Stratakos et al. |
| 6,844,739 | B2 | 1/2005 | Kasai et al. |
| 6,984,970 | B2 | 1/2006 | Capel |
| 7,068,017 | B2 | 6/2006 | Willner et al. |
| 7,126,053 | B2 | 10/2006 | Kurokami et al. |
| 7,514,900 | B2 | 4/2009 | Sander et al. |
| 8,158,877 | B2 | 4/2012 | Klein et al. |
| 8,531,855 | B2 * | 9/2013 | Lee et al. ................. 363/97 |
| 2005/0057214 | A1 | 3/2005 | Matan |
| 2005/0057215 | A1 | 3/2005 | Matan |
| 2005/0121067 | A1 | 6/2005 | Toyomura et al. |
| 2005/0139258 | A1 | 6/2005 | Liu et al. |
| 2005/0172995 | A1 | 8/2005 | Rohrig et al. |
| 2006/0001406 | A1 | 1/2006 | Matan |
| 2006/0174939 | A1 | 8/2006 | Matan |
| 2006/0185727 | A1 | 8/2006 | Matan |
| 2007/0228838 | A1 | 10/2007 | Delmerico et al. |
| 2007/0273351 | A1 | 11/2007 | Matan |
| 2008/0121272 | A1 | 5/2008 | Besser et al. |
| 2008/0122449 | A1 | 5/2008 | Besser et al. |
| 2008/0122518 | A1 | 5/2008 | Besser et al. |
| 2008/0143188 | A1 | 6/2008 | Adest et al. |
| 2008/0179949 | A1 | 7/2008 | Besser et al. |
| 2008/0191560 | A1 | 8/2008 | Besser et al. |
| 2008/0191675 | A1 | 8/2008 | Besser et al. |
| 2008/0236648 | A1 | 10/2008 | Klein et al. |
| 2008/0303503 | A1 | 12/2008 | Wolfs |
| 2009/0195305 | A1 | 8/2009 | Ballarin et al. |
| 2009/0283128 | A1 | 11/2009 | Zhang et al. |
| 2009/0284078 | A1 | 11/2009 | Zhang et al. |
| 2009/0284232 | A1 | 11/2009 | Zhang et al. |
| 2009/0284240 | A1 | 11/2009 | Zhang et al. |
| 2009/0284998 | A1 | 11/2009 | Zhang et al. |
| 2010/0002349 | A1 | 1/2010 | La Scala et al. |
| 2010/0195361 | A1 | 8/2010 | Stem |
| 2010/0202169 | A1 | 8/2010 | Gaboury et al. |
| 2010/0207455 | A1 | 8/2010 | Erickson, Jr. et al. |
| 2010/0253150 | A1 | 10/2010 | Porter et al. |
| 2010/0265747 | A1 | 10/2010 | Egiziano et al. |
| 2010/0288327 | A1 | 11/2010 | Lisi et al. |
| 2010/0327659 | A1 | 12/2010 | Lisi et al. |
| 2011/0062784 | A1 | 3/2011 | Wolfs |
| 2011/0082600 | A1 | 4/2011 | Capel |
| 2011/0285375 | A1 * | 11/2011 | Deboy .................... 323/299 |
| 2012/0043818 | A1 | 2/2012 | Stratakos et al. |
| 2012/0043823 | A1 | 2/2012 | Stratakos et al. |
| 2012/0043923 | A1 | 2/2012 | Ikriannikov et al. |
| 2012/0044014 | A1 | 2/2012 | Stratakos et al. |
| 2012/0075898 | A1 * | 3/2012 | Sigamani et al. ............ 363/131 |
| 2012/0212064 | A1 | 8/2012 | Spanoche et al. |
| 2013/0063108 | A1 * | 3/2013 | Nishida et al. ............. 323/271 |
| 2013/0106194 | A1 | 5/2013 | Jergovic et al. |

FOREIGN PATENT DOCUMENTS

| | | |
|---|---|---|
| KR | 2006-0087957 | 8/2006 |
| KR | 2012-0075970 | 7/2012 |
| TW | 201013359 | 4/2010 |
| TW | 201020712 | 6/2010 |
| WO | WO 2008/097591 | 8/2008 |
| WO | WO 2009/035995 | 3/2009 |

OTHER PUBLICATIONS

Alonso et al., "Cascaded H-Bridge Multilevel Converter for Grid Connected Photovoltaic Generators with Independent Maximum Power Point Tracking of each Solar Array," PESC 2003, Jun. 15-19, 2003, pp. 731-35.

Barchowsky et al., "A Comparative Study of MPPT Methods for Distributed Photovoltaic Generation," PES 2012, Jan. 16-20, 2012, pp. 1-7.

Erickson, Robert W., "Future of Power Electronics for Photovoltaics," Applied Power Electronics Conference and Exposition, Feb. 18, 2009, 23 pages.

Ghaisari et al., "An MPPT Controller Design for Photovoltaic (PV) Systems Based on the Optimal Voltage Factor Tracking," 2007 IEEE Canada Electrical Power Conference, Oct. 25-26, 2007, pp. 359-362.

Koutroulis et al., Development of a Microcontroller-Based Photovoltaic Maximum Power Point Tracking Control System, IEEE Trans. on Power Electronics, Jan. 2001, pp. 46-54.

Lindgren, B., "A Power Converter for Photovoltaic Applications," 2000, 69 pages.

Noguchi et al., "Short-Current Pulse-Based Maximum-Power-Point Tracking Method for Multiple Photovoltaic-and-Converter Module System," IEEE Transactions on Industrial Electronics, Feb. 2002, pp. 217-223.

PCT/US12/60468 International Search Report & Written Opinion mailed Apr. 29, 2013, 18 pages.

Pongratananukul, N., "Analysis and Simulation Tools for Solar Array Power Systems," 2005, 125 pages.

Pulvirenti et al., "DC-DC Converters with MPPT control for Photovoltaic Panels," 25th EU PVSEC/WCPEC-5, Sep. 7, 2010, 8 pages.

Pulvirenti et al., poster, "DC-DC Converters with MPPT control for Photovoltaic Panels," 25th EU PVSEC/WCPEC-5, Sep. 7, 2010, 1 page.

Shmilovitz et al., "Distributed Maximum Power Point Tracking in Photovoltaic Systems—Emerging Architectures and Control Methods," Automatika vol. 53-1012 No. 2, Jun. 2012, pp. 142-155.

St SPV1020 datasheet, Interleaved DC-DC boost converter with built-in MPPT algorithm, Copyright 2010, 18 pages.

Stratakos, A., "High-Efficiency Low-Voltage DC-Dc Conversion for Portable Applications," 1998, 245 pages.

Sullivan, C.R. et al., "A high-efficiency maximum power point tracker for photovoltaic arrays in a solar-powered race vehicle" Abstract, Power Electronics Specialists Conference, 1993. PESC '93 Record., 24th Annual IEEE, 1 page.

Tan, Y. T., "Impact on the Power System With a Large Penetration of Photovoltaic Generation," 2004, 160 pages.

Texas Instruments bq76PL102 datasheet, "PowerLAN Dual-Cell Li-Ion Battery Monitor with PowerPump Cell Balancing," Copyright 2008, 16 pages.

TIGO Energy Module Maximizer-EP (MM-EP) Data Sheet, Copyright 2009, 2 pages.

Walker et al., "Cascaded DC-DC Converter Connection of Photovoltaic Modules," IEEE Trans. on Power Electronics, Jul. 2004, pp. 1130-1139.

Web page, "National Semi SolarMagic Technology—greenpowerZone," retrieved from www.en-genius.net/site/zones/greenpowerZone/product_reviews/grnpowp_071408 on Jun. 29, 2009, 3 pages.

Web page, "SolarMagic Power Optimizers and Blocking Diodes Maximize Solar PV Panel Energy," retrieved from www.solarmagic.com/products on Jun. 29, 2009, 2 pages.

Wolfs et al., "Distributed Maximum Power Tracking for High Performance Vehicle Solar Arrays," AUPEC 2004, Sep. 2004, 6 pages.

First Office Action in related Taiwanese Patent Application No. 102105106 and English-language summary thereof, 9 pages, Oct. 16, 2012.

* cited by examiner

MAXIMUM POWER POINT TRACKING CONTROLLERS AND ASSOCIATED SYSTEMS AND METHODS

BACKGROUND

Photovoltaic cells produce a voltage that varies with current, cell operating condition, cell physics, cell defects, and cell illumination. One mathematical model for a photovoltaic cell, as illustrated in FIG. 1, models output current as:

$$I = I_L - I_0 \left\{ \exp\left[\frac{q(V + IR_S)}{nkT}\right] - 1 \right\} - \frac{V + IR_S}{R_{SH}} \quad \text{EQN. 1}$$

Where
 $I_L$=photogenerated current
 $R_S$=series resistance
 $R_{SH}$=shunt resistance
 $I_0$=reverse saturation current
 n=diode ideality factor (1 for an ideal diode)
 q=elementary charge
 k=Boltzmann's constant
 T=absolute temperature
 I=output current at cell terminals
 V=voltage at cell terminals
 For silicon at 25° C., kT/q=0.0259 Volts.

Typical cell output voltages are low and depend on the band gap of the material used to manufacture the cell. Cell output voltages may be merely half a volt for silicon cells, far below the voltage needed to charge batteries or drive most other loads. Because of these low voltages, cells are typically connected together in series to form a module, or an array, having an output voltage much higher than that produced by a single cell.

Real-world photovoltaic cells often have one or more microscopic defects. These cell defects may cause mismatches of series resistance $R_S$, shunt resistance $R_{SH}$, and photogenerated current $I_L$ from cell to cell in a module. Further, cell illumination may vary from cell to cell in a system of photovoltaic cells, and may vary even from cell to cell in a module, for reasons including shadows cast by trees, bird droppings shadowing portions of a cell or module, dust, dirt, and other effects. These mismatches in illumination may vary from day to day and with time of day—a shadow may shift across a module during a day, and rain may wash away dust or dirt shadowing a cell.

From EQN. 1, output voltage is greatest at zero output current, and output voltage V falls off nonlinearly with increasing output current I. FIG. 2 illustrates the effect of increasing current drawn from a photovoltaic device at constant illumination. As current I is increased under constant illumination, voltage V falls off slowly, but as current I is increased to an output current near the photocurrent $I_L$, output voltage V falls off sharply. Similarly, cell power, the product of current and voltage, increases as current I increases, until falling voltage V overcomes the effect of increasing current, whereupon further increases in current I drawn from the cell cause power P to decrease rapidly. For a given illumination, each cell, module, and array of cells and modules therefore has a maximum power point (MPP) representing the voltage and current combination at which output power from the device is maximized. The MPP of a cell, module, or array will change as temperature and illumination, and hence photogenerated current $I_L$, changes. The MPP of a cell, module, or array may also be affected by factors such as shadowing and/or aging of the cell, module, or array.

Maximum Power Point Tracking (MPPT) controllers for operating a photovoltaic cell at or near its maximum power point have been proposed. These controllers typically determine an MPP voltage and current for a photovoltaic device connected to their input, and adjust their effective impedance to maintain the photovoltaic device at the MPP. However, conventional MPPT controllers often have one or more drawbacks. For example, some proposed MPPT controllers may be relatively slow under certain conditions, thereby delaying MPP operation.

SUMMARY

In an embodiment, a maximum power point tracking controller includes an input port for electrically coupling to an electric power source, an output port for electrically coupling to a load, a control switching device, and a control subsystem. The control switching device is adapted to repeatedly switch between its conductive and non-conductive states to transfer power from the input port to the output port. The control subsystem is adapted to control switching of the control switching device to regulate a voltage across the input port, based at least in part on a signal representing current flowing out of the output port, to maximize a signal representing power out of the output port.

In an embodiment, an electric power system includes an electric power source and a maximum power point tracking controller. The maximum power point tracking controller includes an input port electrically coupled to the electric power source, an output port for electrically coupling to a load, a control switching device, and a control subsystem. The control switching device is adapted to repeatedly switch between its conductive and non-conductive states to transfer power from the electric power source to the output port. The control subsystem is adapted to control switching of the control switching device to regulate a voltage across the input port, based at least in part on a signal representing current flowing out of the output port, to maximize a signal representing power out of the output port.

In an embodiment, a method for operating a maximum power point tracking controller including an input port for electrically coupled to an electric power source and an output port for electrically coupling to a load includes the following steps: (a) repeatedly switching a control switching device of the maximum power point tracking controller between its conductive and non-conductive states to transfer power from the input port to the output port, and (b) controlling switching of the control switching device, based at least in part on a signal representing current flowing out of the output port, to regulate a magnitude of a voltage across the input port such that a signal representing power out of the output port is maximized.

In an embodiment, a method for transferring electric power between an electric power source and a load using a maximum power point tracking controller includes controlling switching of a control switching device of the maximum power point tracking controller, based at least in part on a signal representing current flowing through energy storage inductance of the maximum power point tracking controller, to regulate a voltage across the electric power source, such that: (a) the voltage across the electric power source is greater than or equal to a voltage across the load, and (b) a signal representing power transferred to the load is maximized.

In an embodiment, a multiplier includes a first and a second input port, an output port, a first field effect transistor, a second field effect transistor, a third field effect transistor, and control circuitry. The first field effect transistor is electrically coupled in series with the first input port, the second field effect transistor is electrically coupled in series with the second input port, and the third field effect transistor is electrically coupled in series with the output port. The control circuitry is adapted to control each of the first, second, and third field effect transistors such that a magnitude of current flowing into the output port is proportional to a product of (a) a magnitude of current flowing into the first input port, and (b) a magnitude of current flowing into the second input port.

In an embodiment, an electronic filter includes an integrator subsystem and transconductance circuitry. The integrator subsystem is adapted to operate in a bipolar domain to filter an alternating current component of an input signal. The transconductance circuitry adapted to operate in a unipolar domain to generate an output current signal proportional to an average value of the input current signal.

In an embodiment, a method for filtering an input signal includes filtering an alternating current component of the input signal in a bipolar domain and generating a direct current component of the input signal in a unipolar domain.

In an embodiment, a signal scaling system includes a transconductance subsystem and control logic. The transconductance subsystem is adapted to convert an input voltage signal to an output current signal, and the transconductance subsystem includes a programmable resistor adapted to set a gain of the transconductance subsystem. The control logic is adapted to set a resistance of the programmable resistor to adjust the gain of the transconductance subsystem such that a magnitude of the output current signal is at least as large as a first threshold value.

In an embodiment, a signal level shifter for shifting complementary input voltage signals in a first power supply domain to complementary output voltage signals in a second power supply domain includes a transconductance stage and a load circuit. The transconductance stage is in the first power supply domain and is adapted to generate complementary current signals in response to the complementary input voltage signals. The load circuit is in the second power supply domain and is adapted to generate the complementary output voltage signals in response to the complementary current signals. The load circuit includes first and second inverter circuits adapted to generate the complementary output voltage signals in response to the complementary current signals.

In an embodiment, a system for determining a signal representing power in a maximum power point tracking (MPPT) controller includes a voltage filter subsystem, a current filter subsystem, a voltage scaling subsystem, a current scaling subsystem, and a multiplier. The voltage filter subsystem is adapted to generate a signal representing average voltage across an output port of the MPPT controller by filtering a signal representing voltage across the output port. The current filter subsystem is adapted to generate a signal representing average current flowing out of the output port by filtering a signal representing current flowing out the output port. The voltage scaling subsystem is adapted to generate a scaled signal representing average voltage across the output port by scaling the signal representing average voltage across the output port to be within a first predetermined range. The current scaling subsystem is adapted to generate a scaled signal representing average current flowing out of the output port by scaling the signal representing average current flowing out the output port to be within a second predetermined range. The multiplier adapted to determine the signal representing power from a product of the scaled signal representing average voltage across the output port and the scaled signal representing average current flowing out of the output port.

In an embodiment, a method for determining a signal representing power in a maximum power point tracking (MPPT) controller includes the steps of (a) filtering a signal representing current flowing out of an output port of the MPPT controller to obtain a signal representing average current flowing out of the output port; (b) filtering a signal representing voltage across the output port to obtain a signal representing average voltage across the output port; (c) scaling the signal representing average current flowing out of the output port to obtain a scaled signal representing average current flowing out of the output port; (d) scaling the signal representing average voltage across the output port to obtain a scaled signal representing average voltage across the output port; and (e) multiplying the scaled signal representing average current flowing out of the output port by the scaled signal representing average voltage across the output port to obtain the signal representing power.

DETAILED DESCRIPTION OF THE EMBODIMENTS

Applicants have developed new MPPT controllers that may achieve one or more advantages. For example, certain embodiments of the controllers may operate with a wide variety of loads and may also converge on a MPP relatively quickly.

Figure 1:
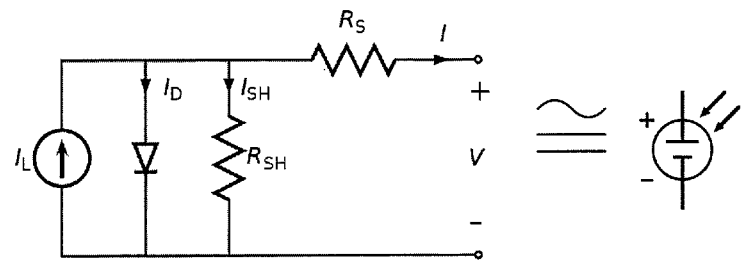
FIG. 1 shows one model of a photovoltaic cell.
Figure 2:
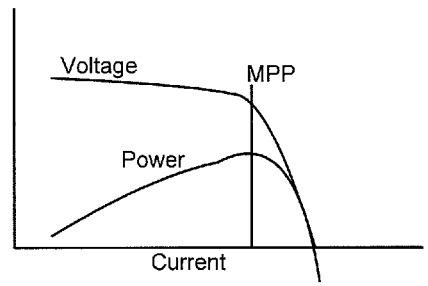
FIG. 2 shows a graph of voltage and power as a function of current for one photovoltaic cell.
Figure 3:
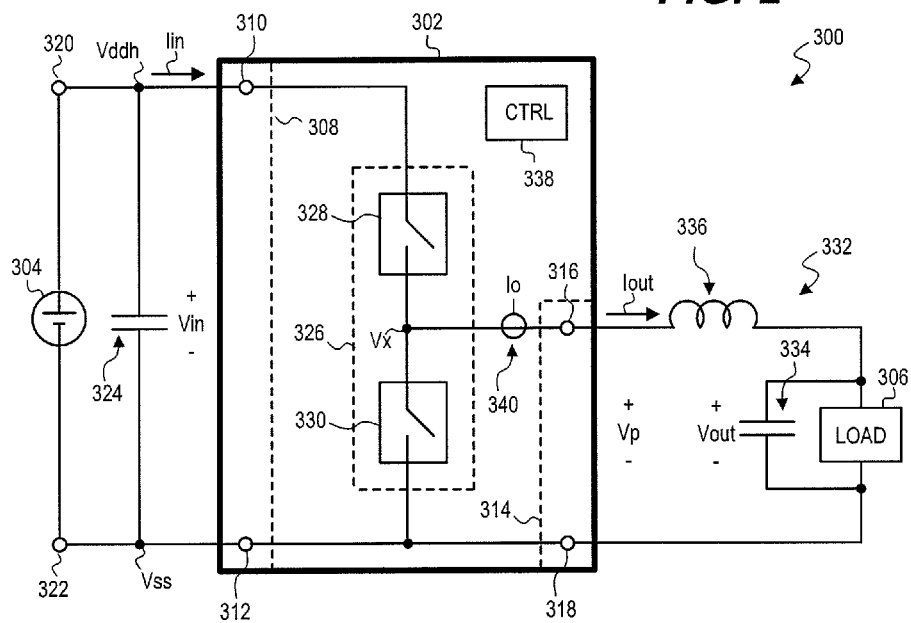
FIG. 3 illustrates an electric power system including a MPPT controller, according to an embodiment.

FIG. 3 illustrates an electric power system 300 including an MPPT controller 302 electrically coupled between an electric power source 304 and a load 306. As discussed below, MPPT controller 302 is adapted to operate electric power source 304 at or near its MPP while transferring power from electric power source 304 to load 306.

MPPT controller 302 includes an input port 308 including input terminals 310, 312 and an output port 314 including output terminals 316, 318. A positive terminal 320 of electric power source 304 is electrically coupled to input terminal 310, and a negative terminal 322 of electric power source 304 is electrically coupled to input terminal 312, such that electric power source 304 is electrically coupled in series with input port 308. Terminals 310, 320 form part of a positive power node or rail (Vddh), and terminals 312, 322 form part of a reference power node or rail (Vss). Electric power source 304 is, for example, a photovoltaic device, such as a photovoltaic module including a plurality of interconnected photovoltaic cells, a single-junction photovoltaic cell, or a multi-junction photovoltaic cell. However, system 300 is not limited to photovoltaic applications. For example, in some alternate embodiments, electric power source 304 is one or more fuel cells or one or more batteries.

System 300 optionally includes one or more input capacitors 324 electrically coupled across input port 308. Capacitors 324 helps supply the ripple component of controller 302 input current Iin, thereby helping minimize the magnitude of ripple current flowing through electric power source 304. Low ripple current magnitude through electric power source 304, in turn, promotes efficient electric power source operation. In certain embodiments where MPPT controller 302 switches at a relatively high frequency, such as at 500 kilohertz or greater, capacitors 324 are multilayer ceramic capacitors, to promote small capacitor size and long capacitor life.

MPPT controller 302 includes a switching circuit 326 electrically coupled across input port 308. Switching circuit 326 includes a control switching device 328 electrically coupled between input terminal 310 and a switching node Vx, and a freewheeling switching device 330 electrically coupled between switching node Vx and input terminal 312. Output terminal 316 is electrically coupled to switching node Vx, and output terminal 318 is electrically coupled to input terminal 312. In this document, a switching device includes, but is not limited to, a bipolar junction transistor, a field effect transistor (e.g., an N-channel or P-channel metal oxide semiconductor field effect transistor (MOSFET) such as a laterally diffused metal oxide semiconductor transistor (LDMOS), a junction field effect transistor, a metal semiconductor field effect transistor), an insulated gate bipolar junction transistor, a thyristor, or a silicon controlled rectifier.

Load 306 is electrically coupled in series with output port 314, to form part of an output circuit 332 electrically coupling load 306 to switching circuit 326. Load 306 includes, for example, an inverter or a battery charger. One or more output capacitors 334 are electrically coupled across load 306 to absorb the ripple component of output current Iout. Capacitors 334 are optionally omitted, though, in embodiments where load 306 includes significant capacitance, such as in embodiments where load 306 is an inverter with significant input capacitance. In certain embodiments where MPPT controller 302 switches at a relatively high frequency, such as at 500 kilohertz or greater, capacitors 334 are multilayer ceramic capacitors to promote small capacitor size and long capacitor life. Output circuit 332 includes energy storage inductance 336. In some embodiments, energy storage inductance 336 includes one or more discrete inductors, as symbolically shown in FIG. 3. However, in some other embodiments, discrete energy storage inductors are omitted, and "parasitic" interconnection inductance associated with a loop forming output circuit 332 serves as energy storage inductance 336.

MPPT controller 302 further includes a control subsystem 338. Switching circuit 326, energy storage inductance 336, and capacitors 334 collectively form a buck converter controlled by control subsystem 338. Control subsystem 338 is adapted to control switching of switching circuit 326 such that the buck converter transfers power from input port 308 to output port 314, thereby transferring power from electric power source 304 to load 306. Specifically, control subsystem 338 causes control switching device 328 to repeatedly switch between its conductive and non-conductive states, typically at a frequency of at least 100 kilohertz, to transfer power from input port 308 to output port 314. Switching device 328 is referred to as the "control" switching device because the ratio of input voltage Vin to output voltage Vout across load 306 is a function of switching device 328's duty cycle.

Control subsystem 338 also controls switching of freewheeling switching device 330 such that it performs a freewheeling function, or in other words, such that freewheeling switching device 330 provides a path for output current Iout flowing between output terminals 316, 318 when control switching device 328 is in its non-conductive state. In some alternate embodiments, freewheeling switching device 330 is replaced with an alternative freewheeling device, such as a diode with its anode electrically coupled to reference node Vss and its cathode electrically coupled to switching node Vx.

MPPT controller 302 further includes a current reconstructor subsystem 340 adapted to generate a signal Io representing output current Iout flowing out of output port 314. In some embodiments, current reconstructor subsystem 340 employs systems and methods disclosed in one or more of U.S. Pat. Nos. 6,160,441 and 6,445,244 to Stratakos et al., each of which is incorporated herein by reference, to generate signal Io. However, current reconstructor subsystem 340 can be implemented in other manners without departing from the scope hereof.

Control subsystem 338 further controls switching of control switching device 328, based partially on signal Io, to regulate input voltage Vin across input port 308 such that a signal representing power out of output port 314 is maximized. In other words, control subsystem 338 adjusts magnitude of Vin such that MPPT controller 302 has an effective input impedance, as seen when looking into input port 308 from electric power source 304, that at least substantially maximizes power out of output port 314. Maximizing power out of output port 314 maximizes power to load 306 and also substantially maximizes power extracted from electric power source 304, since power out of output port 314 is equal to power into input port 308, neglecting losses in MPPT controller 302. Accordingly, the signal representing power out of output port 314 can represent either power into input port 308 or power out of output port 314, since both values are the same, neglecting losses in controller 302. It should be noted that while power into input port 308 and power out of output port 314 are essentially the same, input current Iin and output current Iout will differ, except when control switching device 328 operates at one hundred percent duty cycle.

In some embodiments, the signal representing power out of output port 314 represents actual power out of the output port or actual power into input port 308. In some other embodiments, though, the signal representing power out of output port 314 represents relative power out of the output port or relative power into input port 308. In these embodiments, actual output port or input port power is effectively maximized by maximizing relative output port or input port power.

Some or all of MPPT controller 302 is implemented in a common integrated circuit in certain embodiments, such as to promote small size, small parasitic impedance between components, and fast signal transfer time. In these embodiments, the integrated circuit is optionally copackaged with electric power source 304 to promote small system size and minimal impedance between source 304 and controller 302. However, MPPT controller 302 is not limited to an integrated circuit implementation and could instead be formed partially or completely from discrete components.

Although switching circuit 326, energy storage inductance 336, and capacitors 334 form a buck converter, these components could also be considered to form a boost converter with negative "output" current. In particular, since input voltage Vin is regulated and is greater than or equal to output voltage Vout, switching circuit 326, energy storage inductance 336, and capacitors 334 could be considered to form a boost converter with load 306 electrically coupled to the boost converter's input and electric power source 304 electrically coupled to the boost converter's output. Output current of the boost converter, though, is negative because input current Iin flows from electric power source 304 into MPPT controller 302. Thus, switching circuit 326, energy storage inductance 336, and capacitors 334 can be considered to form either a buck converter with a regulated input voltage Vin, or a boost converter with a negative "output" current Iin, depending on one's viewpoint.

Figure 4:
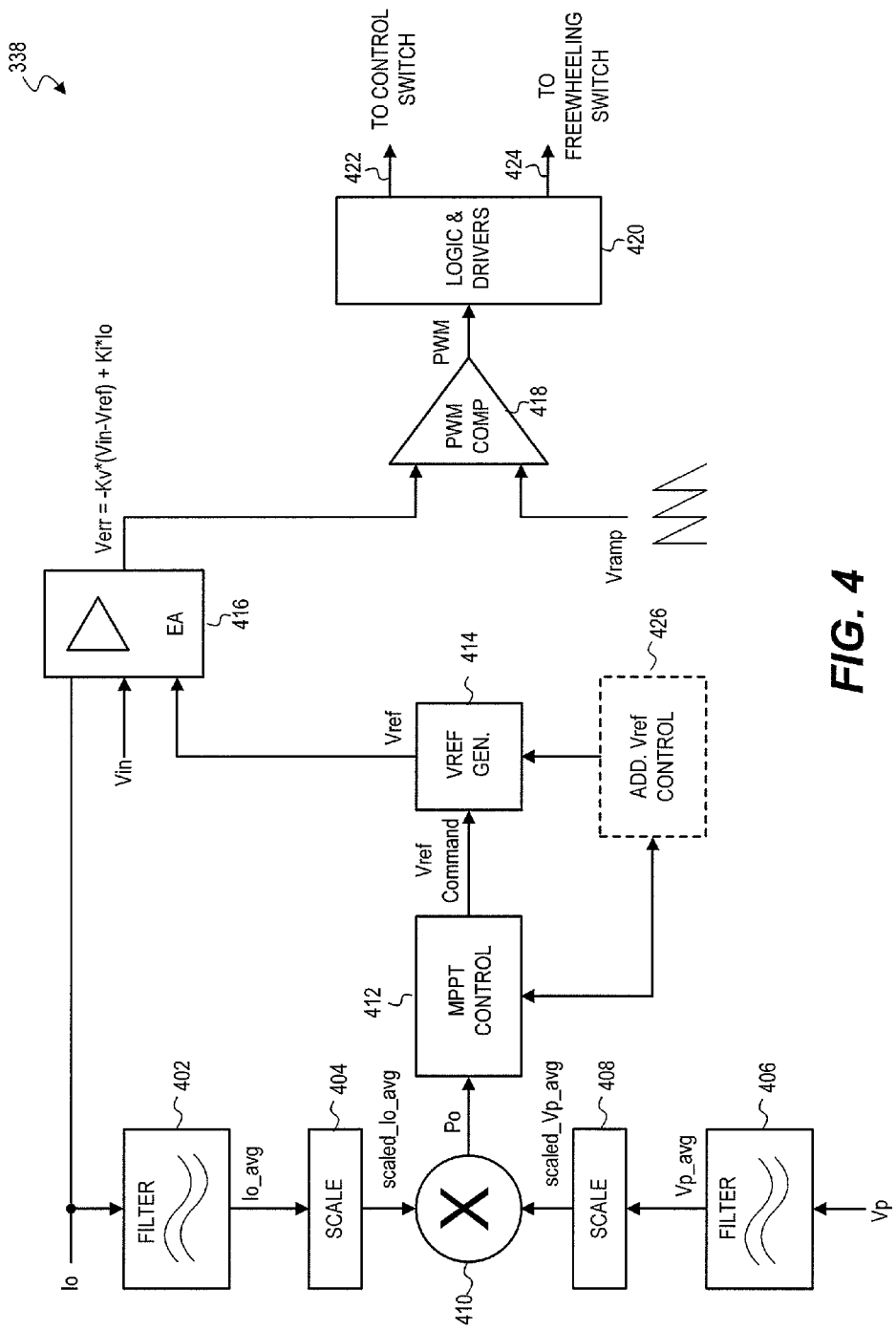
FIG. 4 shows a block diagram of a control subsystem of the FIG. 3 MPPT controller.

FIG. 4 shows a block diagram of control subsystem 338. Control subsystem 338 includes a current filter subsystem 402 adapted to filter the ripple component from signal Io and generate a signal Io_avg representing average current flowing out of output port 314. A current scaling subsystem 404 scales Io_avg to generate a signal scaled_Io_avg, which is signal Io_avg scaled to be within a first range of values. A voltage filter subsystem 406 filters output port voltage Vp, which is a waveform having roughly a square wave shape, to generate a signal Vp_avg representing the average value of voltage Vp across output port 314. In some alternate embodiments, however, voltage Vp is sampled across load 306, instead of across output port 314, thereby enabling voltage filter subsystem 406 to be omitted. A voltage scaling subsystem 408 scales Vp_avg to generate scaled_Vp_avg, which is signal Vp_avg scaled to be within a second range of values. The second range of values of scaling subsystem 408 and the first range of values of scaling system 404 are typically the same to facilitate multiplying scaled_Io_avg and scaled_Vp_avg. Some possible examples of filter subsystems and scaling subsystems are discussed below with respect to FIGS. 7 and 8.

Control subsystem 338 further includes a multiplier 410 adapted to multiply scaled_Io_avg and scaled_Vp_avg to generate a signal Po, which represents and is at least substantially proportional to, both of power out of output port 314 and power into input port 308. An example of one possible implementation of multiplier 410 is discussed below with respect to FIG. 9. MPPT control circuitry 412 generates a signal Vref Command, and a reference voltage generator 414 generates a reference voltage Vref in response to signal Vref Command. MPPT control circuit 412 and reference voltage generator 414 cooperate to set a magnitude of Vref to maximize signal Po, thereby effectively maximizing power out of output port 314 and power into input port 308. One example of this MPPT functionality is discussed below with respect to FIG. 5.

An error amplifier 416 generates an error voltage Verr which is compared to a ramp signal Vramp by a PWM comparator 418 to generate a PWM control signal PWM. Logic and driver circuitry 420 generates signals 422, 424 controlling switching of switching devices 328, 330, respectively, from signal PWM.

Error voltage Verr, generated by error amplifier 416, is given by:

$$Verr = -Kv*(Vin-Vref) + Ki*Io \qquad \text{EQN. 2}$$

where Kv and Ki are scaling factors. These scaling factors are chosen such that the quantity Kv*Vin is greater than the quantity Ki*Io under expected operating conditions to maintain stability. Additionally, scaling factor Kv is typically large because system bandwidth is roughly proportional to Kv*I/Cin, where Cin is total capacitance value of input capacitors 324, and I is the average value of output current Iout. In some embodiments, scaling factor Kv is chosen to be inversely proportional to the expected magnitude of Vin, and Ki is chosen to be inversely proportional to the expected average value of output current Iout. Scaling factors Kv and Ki may be constants, or one or both of these factors may be dynamically adjusted, such as due to operating condition changes.

In some alternate embodiments, though, error amplifier 416 has a slightly different transfer function, given by:

$$Verr = -Kv*(Vin-Vref) + Ki*Iout\_avg \qquad \text{EQN. 3}$$

where Iout_avg is an average value of current Iout. In certain of these embodiments, Iout_avg is signal Io_avg from current filter subsystem 402. In others of these embodiments, however, Iout_avg is derived from other filter circuitry, such as circuitry similar to current filter subsystem 402.

The fact that Verr is a function of Vin promotes fast system response, thereby helping to quickly establish MPP operation. Additionally, the fact Verr is a function of signal Io helps damp the system, thereby helping to minimize, or even eliminate, ringing during operating point step changes associated with MPPT. Furthermore, the fact that MPPT is based on output/input power, as opposed to just voltage or current, potentially enables MPPT controller 302 to work with a wide variety of loads, including both current source loads and voltage source loads.

Control subsystem 338 could be adapted such that signals processed therein are voltage signals, current signals, or a mixture of voltage and current signals, depending on the implementation of the various subsystem blocks. For example, signal Io, representing current flowing out of output port 314, could be either a current signal or a voltage signal, depending on the implementation of current reconstructor subsystem 340. As another example, signal Po, representing power out of output port 314, could be either a current or a voltage signal, depending on the configuration of multiplier 410. Furthermore, control subsystem 338 could be adapted such that the signals processed therein are analog signals and/or digital signals.

Figure 5:
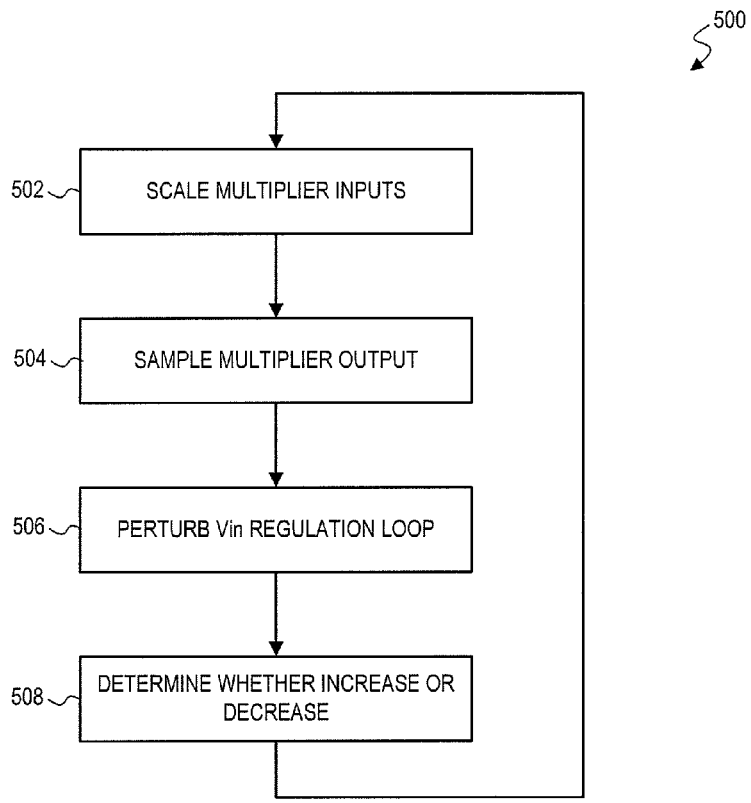
FIG. 5 illustrates one possible operating mode of the control subsystem of the FIG. 3 MPPT controller.

FIG. 5 shows one method 500 for maximizing power transferred out of output port 314 using control subsystem 338. Method 500 can be considered a "perturb and observe" method, where Vref is periodically perturbed, and the effect of the perturbation is observed to determine what direction Vref magnitude should be adjusted to increase signal Po.

In step 502, scaling subsystems 404, 408 are adjusted such that signals scaled_Io_avg and scaled_Vp_avg are within their first and second range of values, respectively. Such signal scaling helps maximize the dynamic range of multiplier 410 when generating signal Po. In step 504, MPPT control circuitry 412 samples and stores multiplier output signal Po to serve as a reference point before Vref perturbation. In step 506, MPPT control circuitry 412 changes the magnitude of Vref by a first step size by changing signal Vref Command to perturb Vref. This Vref perturbation is either positive or negative, depending on whether the last Vref perturbation resulted in an increase or decrease in Po. Specifically, if the last Vref perturbation resulted in an increase in Po, Vref is stepped in the same direction. On the other hand, in the last Vref perturbation resulted in a decrease in Po, Vref is stepped in the opposite direction. In step 508, control circuitry 412 again samples Po and determines whether the Vref perturbation of step 506 increased or decreased Po. Method 500 repeats from time to time, thereby causing control subsystem 338 to operate electric power source 304 at near or at its MPP.

It should be appreciated, though, that control subsystem 338 could be operated by methods other than method 500. For example, MPPT control circuitry 412 could alternately be adapted to determine MPP operating conditions by periodically adjusting signal Vref Command to sweep Vref through a range of values, calculating signal Po at each of these values, and determining which value of Vref resulted in a largest value of signal Po.

Some embodiments of MPPT controller 302 are operable to support one hundred percent duty cycle operation of control switching device 328. In these embodiments, the perturb and observe method of FIG. 5 is modified such that the magnitude of Vref is always decreased step 506 when control switching device 328's duty cycle is one hundred percent. This modification to method 500 is necessary because an increase in Vref at one hundred duty cycle operation would not cause MPPT controller 302's operating conditions to change, since duty cycle increases with increasing Vref, and duty cycle cannot increase beyond one hundred percent.

In some situations, the magnitude of signal Io may be too small for scaling within the first range of values, even at a maximum gain setting of current scaling subsystem 404. A small value of scaled_Io_avg, in turn, may make it difficult or impossible to determine signal Po from the product of scaled_Io_avg and scaled_Vp_avg. Accordingly, current scaling subsystem 404 is optionally adapted such that the magnitude of scaled_Io_avg does not fall below a minimum threshold value, no matter how small the magnitude of Io_avg. In these embodiments, signal scaled_Io_avg will not change in response to a Vref perturbation at small output current Iout values, and average voltage across output port 314, and not output power, is therefore maximized under these conditions. This technique of handling MPP operation at small Iout values advantageously does not require that MPPT control circuitry 412 change modes to support low Iout levels or introduce a discontinuity in the Iout transfer function.

Figure 6:
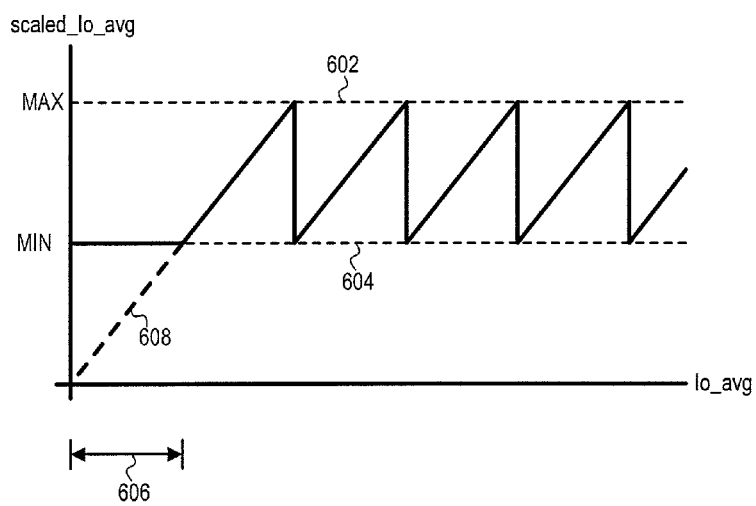
FIG. 6 illustrates one example of operation of a current scaling subsystem with a minimum output value constraint, according to an embodiment.

FIG. 6 illustrates one example of operation of an embodiment where signal scaled_Io_avg is not permitted to fall below a threshold value. In this embodiment, current scaling system 404 is adapted to maintain signal scaled_Io_avg within a first range of values bounded by upper and lower thresholds 602, 604, no matter how small the magnitude of signal Io_avg. During input range 606, magnitude of signal Io_avg is so small that current scaling subsystem system 404 sets signal scaled_Io_avg to its minimum threshold value corresponding to lower threshold 604. Dashed line 608 represents what magnitude scaled_Io_avg would have if current scaling subsystem 404 did not constrain the minimum value of scaled_Io_avg to lower threshold 604.

In some other embodiments, current scaling subsystem 404 is adapted to add a positive offset value to scaled_Io_avg at small magnitude of Io_avg, such that scaled_Io_avg does not fall below a minimum threshold value. For example, consider again input range 606 of FIG. 6. In alternate certain embodiments, current scaling subsystem 404 is adapted to add a positive offset value to scaled_Io_avg when Io_avg is within input range of values 606, such that scaled_Io_avg does not fall below lower threshold 604. In these embodiments, scaled_Io_avg retains the same shape as Io_avg. Thus, dashed line portion 608 would remain a diagonal line, but portion 608 would be shifted into the range of values bounded by upper and lower thresholds 602, 604.

Control subsystem 338 optionally further includes additional Vref control circuitry 426 to implement one or more additional features of controller 302. Although additional Vref control circuitry 426 is symbolically shown as a discrete block, it is optionally integrated into one or more of the other blocks of control subsystem 338, such as into MPPT control circuitry 412.

Additional Vref control circuitry 426 is optionally adapted to prevent Vin from falling below a minimum value and/or from rising above a maximum value. It may be desirable to limit the minimum Vin value to support proper operation of MPPT controller 302. On the other hand, it may be desirable to limit the maximum value of Vin to prevent damage to electric power source 304 and/or MPPT controller 302 due to a high voltage condition, and/or to promote safety. Accordingly, in some embodiments, additional Vref control circuitry 426 is adapted to override MPPT control circuitry 412 and prevent Vref from further decreasing, or even increase Vref, if Vin falls below a threshold value, or if decreasing Vref would cause Vin to fall below the threshold value. Similarly, in some embodiments, additional Vref control circuitry 426 is adapted to override MPPT control circuitry 412 and prevent a further increase in Vref if Vin rises above a threshold value, or if increasing Vin would cause Vref to rise above the threshold value.

Furthermore, in some embodiments, additional Vref control circuitry 426 is adapted to override MPPT control circuitry 412 and decrease Vref if a magnitude of signal Io falls below a threshold value, thereby preventing possible unreliable operation associated with very small output current Iout magnitude. The threshold value is set just above a minimum output current Iout magnitude resolvable by current reconstructor subsystem 340, in a particular embodiment. For example, consider an embodiment where current scaling subsystem 404 is adapted such that the magnitude of scaled_Io_avg does not fall below a minimum threshold value. In this embodiment, average voltage across output port 314, and not output power, is maximized when signal Io falls below the threshold value, as discussed above. Such maximization of average output port 314 voltage, though, may not maximize electric power source 304 power; instead electric power source 304 may operate at a high voltage, low current point below its MPP. Decreasing Vref, however, will increase control switching device 328's duty cycle, thereby increasing output current Iout magnitude and causing electric power source 304 to operate closer to its maximum power point. Decreasing Vref may also potentially increase output current Iout magnitude such that normal MPPT can resume. Accordingly, some embodiments incorporate both (1) circuitry to prevent magnitude of scaled_Io_avg from falling below a threshold value, and (2) circuitry to decrease Vref if magnitude of signal Io falls below a threshold value.

In certain embodiments, control subsystem 338 is adapted to operate control switching device 328 at a fixed duty cycle if signal Io drops below a threshold value indicating potential negative output current. Operating switching device 328 at a fixed duty cycle facilitates operating with reverse current, where Iout has a negative value, instead of a positive value. Reverse current conditions may occur in applications where one or more additional electric power sources are electrically coupled to output port 314, such as in applications including strings of parallel connected photovoltaic devices. It is anticipated that control subsystem 338 will operate control switching device 328 at a large fixed duty cycle, such as ninety five or one hundred percent duty cycle, when signal Io indicates potential negative output current. The threshold value indicating potential negative output current will typically be set lower than other low output current thresholds, such as the threshold to decrease Vref if Io falls below a threshold value, discussed above.

In some situations, it may be desirable to reduce the size of Vref perturbations at high control switching device 328 duty cycle to promote more robust MPPT, since large Vref step sizes at high duty cycle may cause undesirable operation. As can be seen from EQN. 2 and FIG. 4, duty cycle change in response to a given Vref step is not necessarily constant because duty cycle change may vary as a function of Io and other factors. Duty cycle change is typically greater at small Io values than at large Io values, and low Io values typically correspond to large duty cycle operation. Thus, a given Vref step will often cause a relatively large duty cycle step at high duty cycle operation. A large duty cycle step, in turn, may negatively affect MPPT and/or load 306 operation.

Accordingly, in some embodiments, additional Vref control circuitry 426 cooperates with MPPT control circuitry 412 such that MPPT control circuitry 412 changes Vref by a smaller step size at high duty cycle than at low duty cycle. In particular, circuitry 412, 426 causes Vref to be changed by a first step size during MPPT when a command to control a duty cycle of control switching device 328 is below a first threshold value, and circuitry 412, 426 causes Vref to be changed by a second step size during MPPT when a command to control a duty cycle of control switching device 328 is above a second threshold value. The second step size is smaller than the first step size, and the first threshold value is less than or equal to the second threshold value. It is envisioned that in many embodiments the first threshold value will be less than the second threshold value to achieve hysteresis between large and small Vref step size operating modes. The command to control duty cycle of control switching device 328 is derived, for example, from signal 422 generated by logic and driver circuitry 420.

It may also be desirable to reduce the size of Vref perturbations when operating at or near MPP, since Vref perturbations will temporarily cause electric power source 304 to operate away from its MPP in such case. Thus, in some embodiments, additional Vref control circuitry 426 cooperates with MPPT control circuitry 412 such that MPPT control circuitry 412 changes Vref by a smaller step size when electric power source 304 is close to its MPP, than when electric power source 304 is far from its MPP. In particular, circuitry 412, 426 causes Vref to be changed by a first step size during MPPT when a difference in Po between successive Vref perturbations is below a first threshold value, and circuitry 412, 426 causes Vref to be changed by a second step size during MPPT when a difference in Po between successive Vref perturbations is above a second threshold value. The second step size is larger than the first step size, and the first threshold value is less than or equal to the second threshold value. It is envisioned that in many embodiments the first threshold value will be less than the second threshold value to achieve hysteresis between large and small Vref step size operating modes.

It is desirable to quickly reach MPP operation in many applications. Therefore, in certain embodiments, control subsystem 338 is adapted to quickly change Vref when MPPT controller 302 is operating at extreme points that are not likely to represent MPP operation, such as at start-up, thereby facilitating quick convergence on MPP operation. In these embodiments, MPPT control circuitry 412 and additional Vref control circuitry 426 cooperate such that MPPT control circuitry 412 changes Vref at a faster rate when control switching device 328 is at extreme duty cycle conditions, than when control switching device 328 is at normal duty cycle conditions. In particular, circuitry 412 changes Vref at a first rate when a command to control duty cycle of control switching device 328 is within a first range of values, and circuitry 412 changes Vref at a second rate when a command to control duty cycle of control switching device 328 is within a second range of values. The second rate is greater than the first rate, and the second range of values represents extremely large or small duty cycle command, while the first range of values represents normal duty cycle command. For example, in one embodiment, the first range of values represents a command that control switching device 328's duty cycle be between zero and one hundred percent, while the second range of values represents a command that control switching device 328's duty cycle be less than zero or greater than 100 percent.

In embodiments where electric power source 304 is a photovoltaic device, it may be possible to roughly estimate the device's MPP from its open circuit voltage before MPPT controller 302 begins switching. In particular, a photovoltaic device's MPP typically occurs somewhere between eighty percent to ninety-five percent of its open circuit voltage. Initially setting Vref to this range of photovoltaic device open circuit voltage may speed MPP operation.

Therefore, in some embodiments, additional Vref control circuitry 426 is adapted to set an initial value of Vref based at least partially on an initial average voltage across input port 308, at start-up of MPPT controller 302. For example, in some embodiments, additional Vref control circuitry 426 is adapted to set an initial value of Vref at start-up so that control switching device 328 initially operates at a duty cycle that roughly maintains the average voltage across input port 308 to a fraction of its initial value, such as to within eighty to ninety-five percent of its initial value. MPPT control circuitry then adjusts Vref magnitude to achieve MPP operation, such as discussed above with respect to FIG. 5.

In certain embodiments, control switching device 328 and/or freewheeling switching device 330 include one or more switching devices that are dynamically sized field effect transistors (FETs). Such dynamically sized FETs each include a number of individually controllable elements in the form of constituent FETs electrically coupled in parallel, where the number of such constituent FETs that are active can be varied to dynamically size the FET. The FET's properties can be varied by changing its size, i.e., the number of its constituent FETs that are active. For example, overall FET channel resistance can be decreased by increasing FET size, i.e., increasing the number of constituent FETs that are active. However, the more constituent FETs that are active, the greater the gate capacitance and associated switching loss (assuming each constituent FET is driven by a common driver). For each duty cycle, there is typically an optimal FET size that minimizes the sum of resistance-related and gate-capacitance-related losses.

In some embodiments including one or more dynamically sized FETs and current reconstructor subsystem 340, control subsystem 338 decreases FET size, i.e., decreases the number of active constituent FETs, if the magnitude of signal Io_avg falls below a threshold value, to change the gain of current reconstructor subsystem 340. In these embodiments, gain of current reconstructor subsystem 340 is at least partially dependent on the number of constituent FETs that are active, and gain increases as the number of active constituent FETs decreases. Thus, decreasing FET size increases reconstructor gain and magnitude of signal Io_avg, thereby potentially reducing, or even eliminating, difficulties associated with low magnitude of signals Io_avg/Io_avg_scaled, such as the difficulties discussed above with respect to FIG. 6. Accordingly, decreasing FET size may enable control subsystem 338 to perform MPPT at lower output current Io magnitudes than would be feasible without decreasing FET size.

Figure 7:
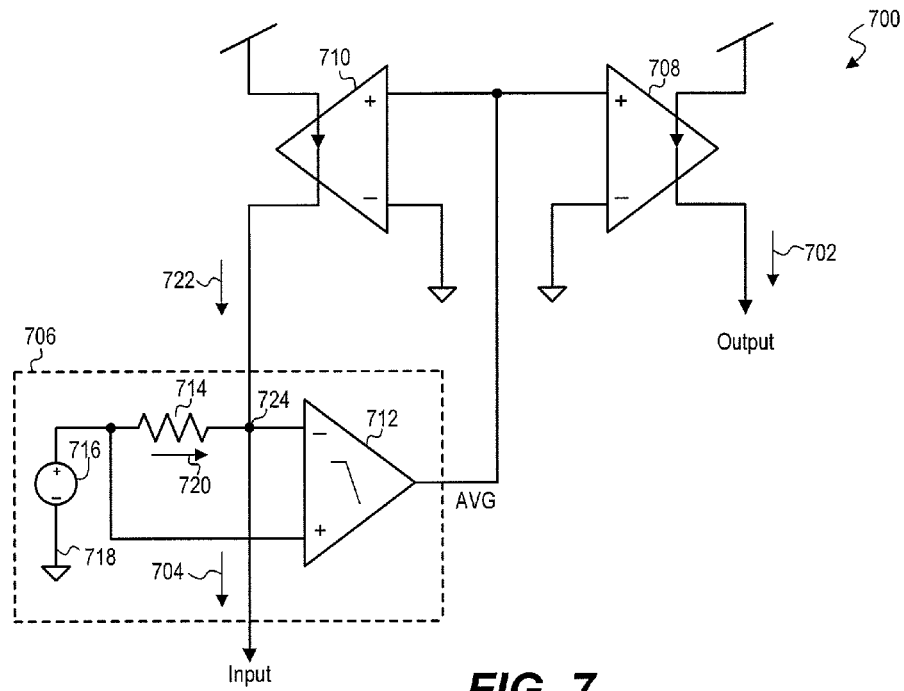
FIG. 7 illustrates an electronic filter, according to an embodiment.

FIG. 7 illustrates an electronic filter 700. Each of current and voltage filter subsystems 402, 406 include, for example, an instance of filter 700. However, filter subsystems 402 and/or 406 could alternately be implemented with different filter types. For example, in some other embodiments, voltage filter subsystem 406 is implemented with an R-C filter to promote simplicity and low cost. Furthermore, electronic filter 700 is not limited to use in control subsystem 338.

Filter 700 is operable to generate an output current signal 702 representing an average value of an input current signal 704. Output current signal 702 is a unipolar signal under intended operating conditions, even in situations where input current signal 704 is a bipolar signal, such as when input current signal 704 has a small direct current (DC) component and a large alternating current (AC) component. In the context of this document, a unipolar signal remains either positive or negative. In other words, a unipolar signal does not change between positive and negative values. A bipolar signal, on the other hand, changes between positive and negative values. As known in the art, it is often much simpler to process a unipolar signal than a bipolar signal. For example, a two-transistor current mirror can be used to scale a unipolar signal, while significantly more complicated circuitry is required to scale a bipolar signal. Accordingly, the fact that output current signal 702 is a unipolar under intended operating conditions may be particularly advantageous in certain applications.

Filter 700 includes an integrator subsystem 706 and transconductance circuitry including first and second transconductance amplifiers 708, 710. Integrator subsystem 706 includes an integrator 712 having inverting and non-inverting input terminals, a resistive device 714 electrically coupled across the integrator's input terminals, and a constant voltage source 716 electrically coupled between the integrator's non-inverting input and a reference node 718. The integrator's inverting input is electrically coupled to a node 724. An AC component 720 of input current signal 704 flows through resistive device 714 into node 724, thereby creating an AC signal across the integrator 712's input terminals. Integrator 712 integrates this AC signal and generates an integrator signal AVG representing the average value of input current signal 704.

Second transconductance amplifier 710 generates a current signal 722 flowing into node 724 in response to integrator signal AVG, such that integration subsystem 706 and second transconductance amplifier 710 collectively form a closed-loop low pass filter. Current signal 722 represents the DC component of input current signal 704, such that DC current signal 722 and AC current signal 720 collectively form input current signal 704 flowing out of node 724. First transconductance amplifier 708 is also controlled by integrator signal AVG to generate output current signal 702 which mirrors DC current signal 722 and is therefore proportional to the average value of input current signal 704.

Accordingly, integrator subsystem 706 operates in a bipolar domain to filter the bipolar or AC component of input current signal 704, while first and second transconductance amplifiers 708, 710 operate in a unipolar domain to handle the unipolar or DC component of input current signal 704. This separate handling of the bipolar and unipolar components of input current signal 704 promotes ease of filtering the bipolar AC component of input current signal 704 while maintaining accuracy of the unipolar DC component.

Figure 8:
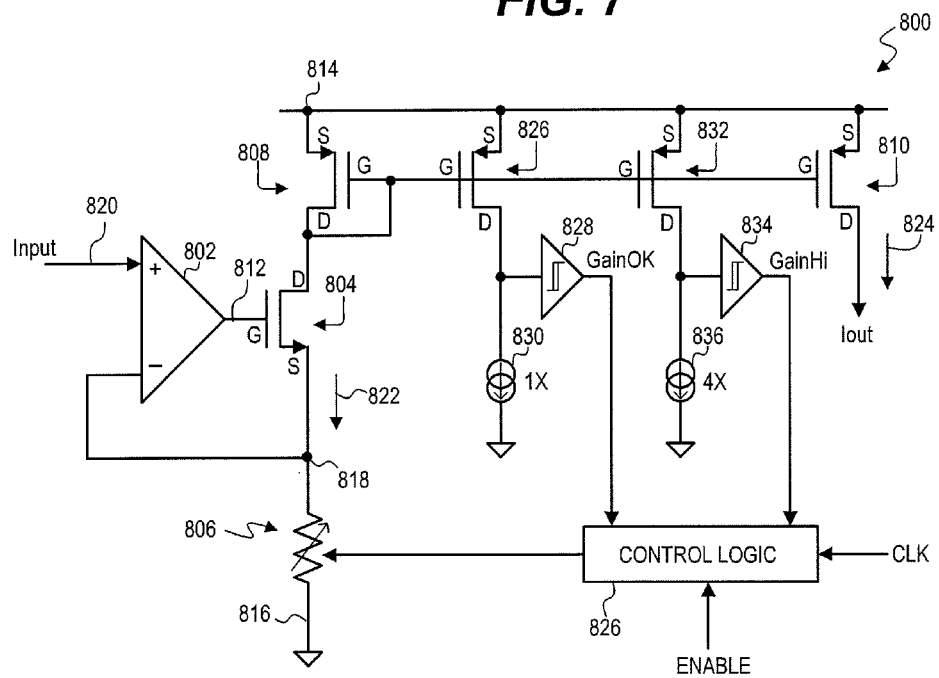
FIG. 8 illustrates a signal scaling subsystem, according to an embodiment.

FIG. 8 illustrates a signal scaling subsystem 800. Each of current and voltage scaling subsystems 404, 408 include, for example, an instance of scaling subsystem 800. However, scaling subsystems 404 and/or 408 could alternately include different scaling circuitry. Furthermore, signal scaling subsystem 800 is not limited to use in control subsystem 338.

Subsystem 800 includes an amplifier 802, a control transistor 804, a programmable resistor 806, and mirror transistors 808, 810. In the context of this document, field effect transistor terminals labeled G, D, and S correspond to gate, drain, and source terminals, respectively. An output 812 of amplifier 802 drives control transistor 804, which is electrically coupled between mirror transistor 808 and programmable resistor 806. Mirror transistor 808 is electrically coupled between a high side power node or rail 814 and control transistor 804, and programmable resistor 806 is electrically coupled between control transistor 804 and a reference node or rail 816. An inverting input of amplifier 802 is electrically coupled to a node 818 joining control transistor 804 and programmable resistor 806, and a non-inverting input of amplifier 802 receives an input voltage signal 820.

Amplifier 802 controls operation of control transistor 804 such that a current signal 822 flowing through transistor 804 and programmable resistor 806 causes a voltage across programmable resistor 806 to equal input voltage signal 820. Thus, amplifier 802 regulates voltage across variable resistor 806 in response to input voltage signal 820. Transistor 810 mirrors current signal 822 to generate an output current signal 824 proportional to current signal 822. A resistance value of programmable resistor 806 is set by control logic 826. Thus, amplifier 802, control transistor 804, programmable resistor 806, and mirror transistors 808, 810 form a transconductance subsystem operable to convert input voltage signal 820 to output current signal 824, where control logic 826 sets resistance of programmable resistor 806 to control transconductance subsystem gain.

As gain range is increased, the number of gain steps required to achieve a desired gain change at each step also increases. Thus, in certain embodiments, programmable resistor 806 and control logic 826 are chosen such that gain changes by a factor of square root of two at each gain step, to provide a compromise between a large gain range and number of gain steps.

Subsystem 800 further includes an additional mirror transistor 826 which mirrors current signal 822. A comparator 828 compares the mirrored current signal to a reference current signal 830, and comparator 828 outputs a GainOK signal if the mirrored current signal is at least as large as the reference current signal. Upon assertion of an enable signal ENABLE, control logic 826 sets programmable resistor 806 to its largest resistance value, thereby setting gain to a minimum value. Control logic 826 then incrementally decreases resistance of programmable resistor 806 in response to a clock signal CLK, thereby incrementing gain, until assertion of a GainOK signal from comparator 828. Thus, signal scaling subsystem 800 scales output current signal 824 to have a magnitude at least as large as reference signal 830, upon assertion of signal ENABLE. In embodiments of control subsystem 338 incorporating instances of subsystem 800 as scaling subsystems, signal ENABLE is asserted, for example, upon execution of step 502 of method 500 (FIG. 5).

In certain embodiments of control subsystem 338 incorporating instances of subsystem 800 as scaling subsystems, a Vref perturbation might cause a large increase in scaled_Io_average and/or scaled_Vp_avg, before scaling subsystems 404, 408 rescale their outputs. Such large increase in signal magnitude may saturate multiplier 410, thereby causing inaccurate MPPT operation. Accordingly, subsystem 800 optionally further includes mirror transistor 832, comparator 834, and reference current source 836 to detect a large increase in output current signal 824 magnitude, which may cause improper MPPT operation.

In particular, mirror transistor 832 mirrors current signal 822, and comparator 834 compares the mirrored current signal to a reference current signal 836, which is larger than reference current signal 830. In some embodiments, reference current signal 836 is four times reference current signal 830 and represents a threshold value at which output current signal 824 magnitude is considered excessively large. Comparator 834 outputs a GainHi signal if the magnitude of the mirror current is at least as large as reference current signal 836 magnitude.

In certain embodiments of control subsystem 338 incorporating instances of subsystem 800 as scaling subsystems, MPPT control circuitry 412 responds to a GainHi assertion by assuming that the perturbation increases Po magnitude, without comparing Po magnitudes before and after the perturbations. As discussed above, a Po calculation may not be accurate after large signal increase as indicated by a GainHi assertion, and comparing Po values after a GainHi assertion may cause erroneous MPPT operation.

Certain embodiments of signal scaling subsystem 800 may achieve one or more advantages that would not necessarily be realized by conventional signal scaling subsystems. For example, gain of subsystem 800 is inversely proportional to resistance of programmable resistor 806, thereby allowing subsystem 800 to achieve a wide range of gain, simply by changing resistance of programmable resistor 806.

As another example, the configuration of subsystem 800 promotes quick settling of gain after a gain step change, with a settling time that remains relatively constant as gain changes. In particular, control transistor 804 acts as a near unity gain buffer, regardless of the resistance of programmable resistor 806, neglecting second order effects. Thus, the loop gain of amplifier 802 is nearly constant as resistor 806 changes, resulting in the bandwidth and settling time of amplifier 802 also remaining relatively independent of resistor 806 resistance value. Accordingly, amplifier 802 can typically be selected to provide sufficiently fast settling time without having to account for gain changes.

Figure 9:
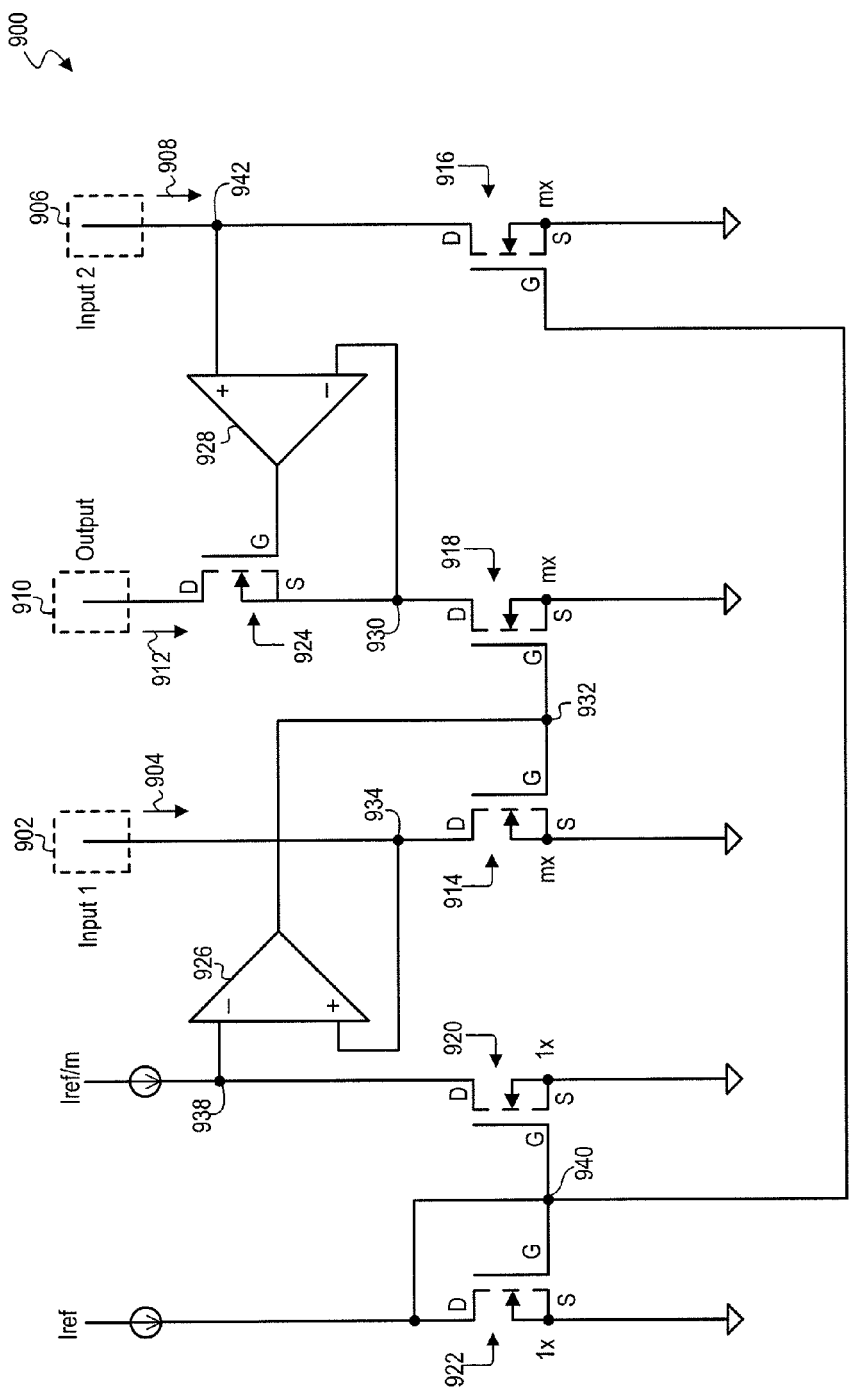
FIG. 9 illustrates a multiplier, according to an embodiment.

FIG. 9 illustrates a multiplier 900. Multiplier 410 of control subsystem 338 is implemented, for example, using multiplier 900. However, multiplier 410 could alternately be implemented in a different manner. Furthermore, multiplier 900 is not limited to use in control subsystem 338.

Multiplier 900 includes a first input port 902, a second input port 906, and an output port 910. A first input current signal 904 flows into first input port 902, a second input current signal 908 flows into second input port 906, and an output current signal 912 flows into output port 910. A first field effect transistor 914 is electrically coupled in series with first input port 902, a second field effect transistor 916 is electrically coupled in series with second input port 906, and a third field effect transistor 918 is electrically coupled in series with output port 910. As discussed below, multiplier 900 further includes control circuitry adapted to control each of the first, second, and third transistors such that the transistors operate in their linear or triode regions and the magnitude of output current signal 912 is proportional to the product of (a) the magnitude of first input current signal 904, and (b) the magnitude of second input current signal 908.

The control circuitry includes fourth, fifth, and sixth field effect transistors 920, 922, 924, as well as amplifiers 926, 928. The gates of first and third transistors 914, 918 are electrically coupled together at a common node 932, while the gates of second, fourth, and fifth transistors 916, 920, 922 are electrically coupled together at a different common node 940. Fourth and fifth transistors 920, 922 each have x matched unit cell transistors, where x is an integer greater than zero. Accordingly, transistors 920, 922 will have the same channel resistance when operated at the same gate-to-source voltage, since both transistors have the same number of matched unit cell transistors. First, second, and third transistors 914, 916, 918, on the other hand, have m*x matching unit cell transistors, where m is an integer greater than one. Accordingly, each of transistors 914, 916, and 918 will have a channel resistance equal to R/m, where R is the channel resistance of transistor 920 or 922, assuming that each of transistors 914, 916, 918, 920, and 922 are operated at a common gate-to-source voltage.

Amplifier 926 is adapted to control the gate of first transistor 914 such that its channel resistance, R914, is determined by the voltage at reference node 938 and first input current signal 904. Specifically, amplifier 926 forces the voltage across first transistor 914, which is equal to the voltage on node 934, to be the same as the voltage across fourth transistor 920, such that:

$$R914 = V938/I904 \qquad \text{EQN. 4}$$

where V938 is the voltage on node 938 and I904 is the magnitude of first input current signal 904. Each transistor 914, 918 has the same channel resistance since both transistors have m*x matching unit cell transistors and are driven by a common gate-to-source voltage from amplifier 926.

Amplifier 928 controls the gate of sixth transistor 924 such that the voltage across second transistor 916 is the same as the voltage across third transistor 918, which is equal to voltage on node 930. Accordingly, the magnitude of output current signal 912 is given by:

$$I912 = V942/R914 = V942/(V938/I904) = I904*(V942/V938) \qquad \text{EQN. 5}$$

where I912 is the magnitude of output current signal 912 and V942 is the voltage on node 942. Voltage at reference node 938 is given by the following:

$$V938 = (Iref/m)*R920 \qquad \text{EQN. 6}$$

where R920 is the channel resistance of fourth transistor 920. Fourth and fifth transistors 920, 922 form a current mirror configured such that a drain-to-source current flowing through fifth transistor 922 has a magnitude equal to Iref, and a drain-to-source current flowing through fourth transistor 920 has a magnitude equal to Iref/m. As discussed below, this configuration helps ensure that transistors 914, 916, 918, 920 operate in their triode region, as required for proper operation.

The gates of second and fourth transistors 916, 920 are both coupled to node 940, such that channel resistance R916 of second transistor 916 is given by:

$$R916 = R920/m \qquad \text{EQN. 7}$$

Accordingly, it can be shown that the voltage on node 942 is given by:

$$V942 = I908*R916 = I908*(R920/m) \qquad \text{EQN. 8}$$

where I908 is the magnitude of second input current signal 908. The ratio of voltage at node 942 to the ratio of voltage at node 938 is therefore given by:

$$V942/V938 = I908*(R920/m)/[(Iref/m)*R920] = I908/Iref \qquad \text{EQN. 9}$$

Substituting EQN. 9 into EQN. 5 yields the following:

$$I912 = (I904*I908)/Iref \qquad \text{EQN. 10}$$

EQN. 10 shows that the magnitude of output current signal 912 is proportional to the product of (a) magnitude of first input current signal 904 and (b) magnitude of second input current signal 908. EQN. 10 also shows that output current signal 912 is inversely proportional to reference current signal Iref.

Multiplier 900 may achieve one or more advantages that would not necessarily be realized by conventional multipliers. For example, input signals 904, 908 and output signal 912 are each current signals, as opposed to voltage signals, which may ease interfacing multiplier 900 with external circuitry in certain applications. As another example, certain embodiments will operate with a single unipolar power supply and signals referenced to ground, as opposed to requiring a split power supply or that signals be referenced to a mid-rail potential. Additionally, certain embodiments of multiplier 900 do not require resistors, as shown in FIG. 9. Forming a circuit without resistors may be particularly advantageous in integrated circuit implementations, since resistors can occupy significant integrated circuit die area.

Furthermore, the configuration of multiplier 900 promotes reliable operation at less than optimal conditions, such as at temperature and/or manufacturing process corners, by helping ensure that transistors 914, 916, 918, 920 operate in their linear or triode regions, as required for proper operation. In particular, configuring multiplier 900 such that a drain-to-source current of fourth transistor 920 is m times smaller than a drain-to-source current of fifth transistor 922 ensures that fourth transistor 920 operates in its triode region, and that voltage on reference node 938 is relatively low. The low voltage on reference node 938 also causes first and third transistors 914, 198 to operate in their triode regions, since amplifier 926 forces the voltage across first transistor 914 to be the same as the voltage on reference node 938. Second transistor 916, in turn, will operate in its triode region as long as its drain-to-source current is less than m*Iref, since this transistor is controlled by fifth transistor 922. Thus, the larger value of parameter m, the further transistors 914, 916, 918, 920 operate in their triode region. As long as m is greater than two and the magnitude of both first and second input current signals 904, 908 is less than Iref, transistors 914, 916, 918, 920 will operate in their triode regions, even at temperature and/or manufacturing process corners.

As discussed above, logic and driver circuitry 420 (FIG. 4) outputs two signals 422, 424, controlling switching devices 328, 330. Each of signals 422, 424 will typically be in a different power supply domain due to the control and freewheeling switching devices being referenced to difference nodes.

Figure 10:
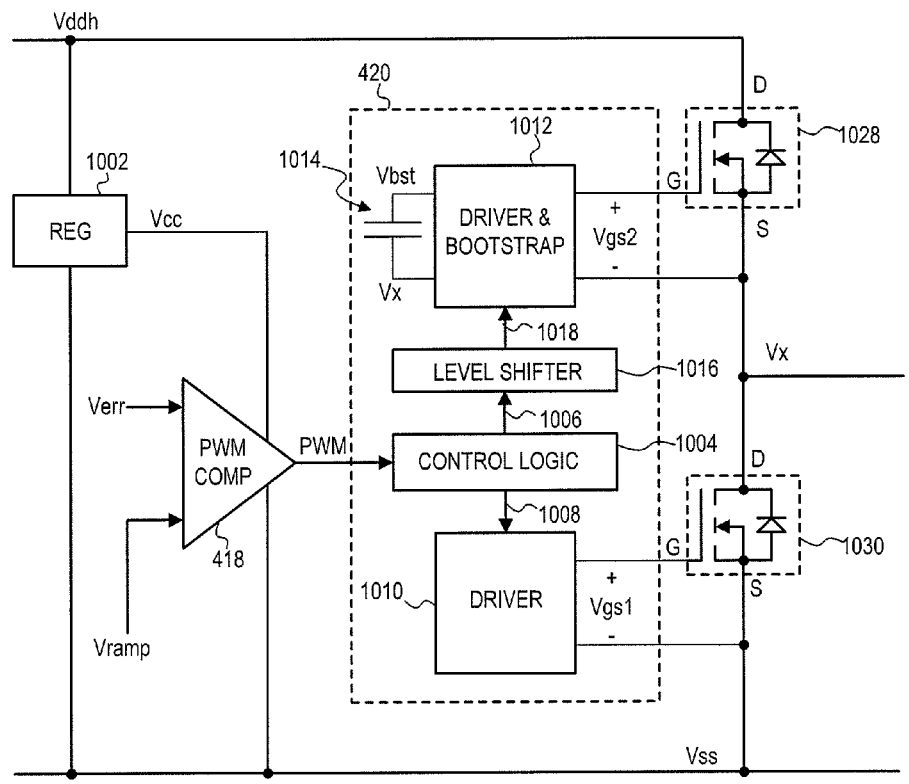
FIG. 10 illustrates one possible implementation of logic and driver circuitry in an embodiment of the FIG. 3 MPPT controller where the control and freewheeling switching devices are implemented by N-channel field effect transistors.

For example, FIG. 10 one possible implementation of logic and driver circuitry 420 in an embodiment where control switching device 328 is implemented as an N-channel field effect transistor 1028, and freewheeling switching device 330 is implemented as an N-channel field effect transistor 1030. It should be understood, though, that MPPT controller 302 is not limited to the FIG. 10 implementation.

A regulator 1002 generates a "housekeeping" power rail (Vcc) from positive power node Vddh. Vcc is referenced to reference power node Vss, and Vcc, or another rail derived therefrom, is used to power much of the circuitry, such as PWM comparator 418, in control subsystem 338.

Signal PWM is in the Vcc/Vss power supply domain, due to PWM comparator 418 being powered from the Vcc power rail, which is referenced to Vss. Control logic 1004 of circuitry 420 converts signal PWM into a control switch signal 1006 for controlling transistor 1028 and into a freewheeling signal 1008 for controlling transistor 1030. Both of signals 1006, 1008 are in the Vcc/Vss power supply domain. Driver circuitry 1010 generates a gate drive voltage signal Vgs1 in response to freewheeling signal 1008. Gate drive voltage signal Vgs1 drives transistor 1030, or in other words, controls the gate to source voltage of transistor 1030 to control switching of transistor 1030. Transistor 1030's source is electrically coupled to reference node Vss. Accordingly, gate drive voltage signal Vgs1 is also in the Vcc/Vss power supply domain.

Control transistor 1028 is referenced to switching node Vx, instead of to reference node Vss. A booststrap component of driver and bootstrap circuitry 1012 generates a "bootstrap" voltage rail (Vbst), which is referenced to switching node Vx, to allow circuitry 1012 to drive transistor 1028's gate positive with respect to the transistor's source. An energy storage element, such as a capacitor 1014, is used to store energy for the bootstrap voltage rail. Driver and bootstrap circuitry 1012 generates a gate drive voltage signal Vgs2 in the Vbst/Vx power supply domain to drive transistor 1028.

Figure 11:
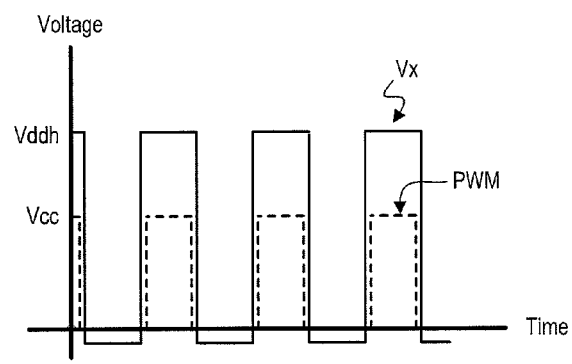
FIG. 11 shows a graph of switching node voltage versus time for the FIG. 3 MPPT controller.

Signals in the Vcc/Vss domain cannot be directly electrically coupled to the Vbst/Vx domain due to the two domains having difference references. In particular, reference Vss in the Vcc/Vss domain is essentially at a constant voltage. The Vbst/Vx domain, on the other hand, is referenced to switching node Vx, which has a large voltage swing. For example, FIG. 11 shows a graph of voltage on switching node Vx versus time. Signal PWM is also shown on the graph by dashed lines. As can be observed, voltage of switching node Vx changes significantly in response to changes in signal PWM.

Figure 12:
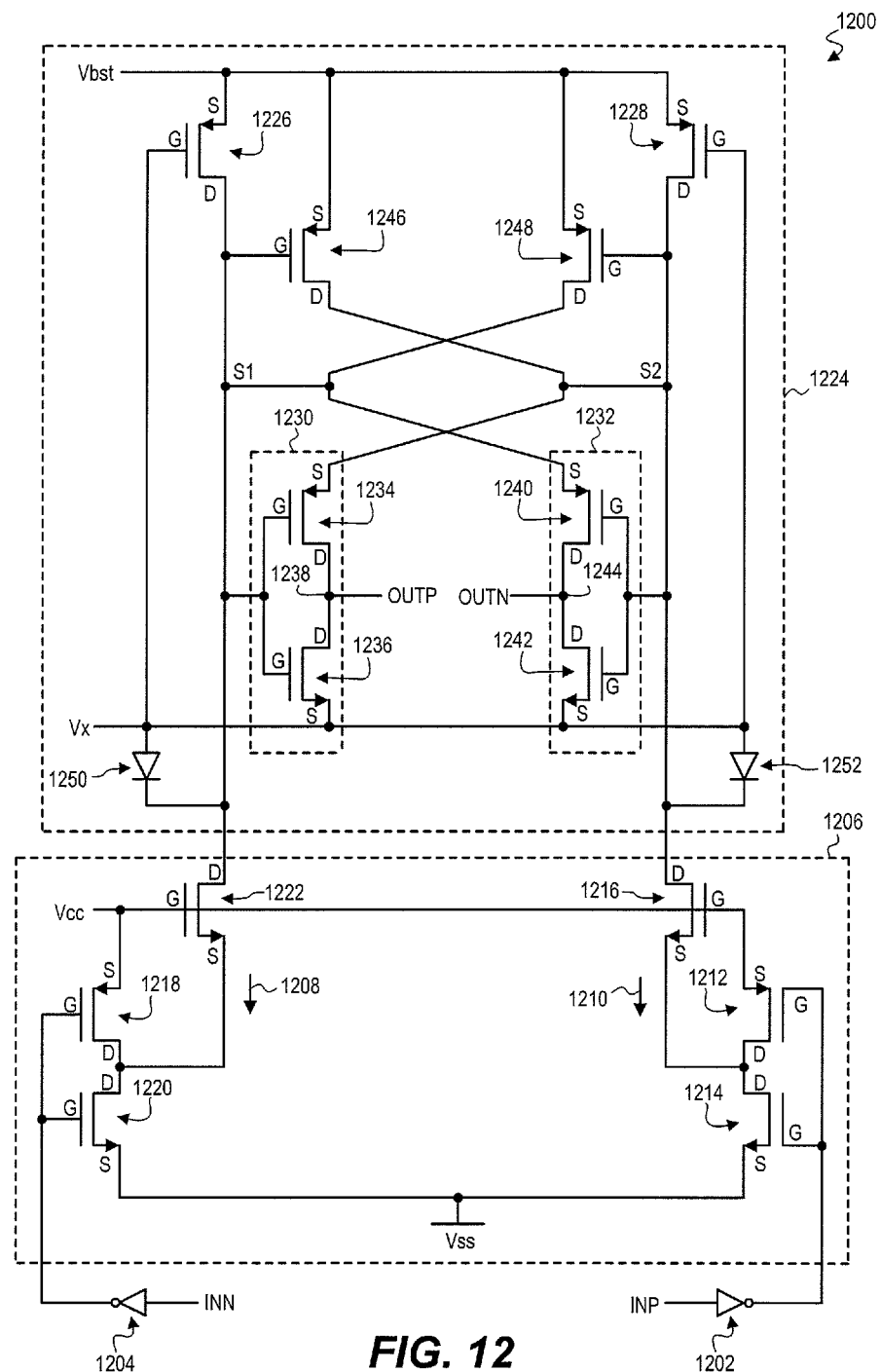
FIG. 12 illustrates a signal level shifter, according to an embodiment.

Accordingly, logic and driver circuitry 420 includes a level shifter 1016 to shift control switch signal 1006 from the Vcc/Vss domain to a signal 1018 in the Vbst/Vx domain. Thus, level shifter 1016 interfaces control logic 1004, which is in the Vcc/Vss domain, with driver and bootstrap circuitry 1012, which is in the Vbst/Vx domain. FIG. 12 shows a signal level shifter 1200, which is one possible implementation of level shifter 1016. It should be appreciated, however, that level shifter 1016 could be implemented in other manners. Additionally, level shifter 1200 is not limited to use in circuitry 420.

Level shifter 1200 receives complementary input signals INP, INN, which are in the Vcc/Vss power supply domain. An inverter 1202 inverts signal INP, and an inverter 1204 inverts signal INN, before these signals are coupled to a transconductance stage 1206 in the Vcc/Vss power supply domain. Transconductance stage 1206 is adapted to generate complementary current signals 1208, 1210 in response to input signals INP, INN.

The output of inverter 1202 is electrically coupled to the gates of P-channel and N-channel field effect transistors 1212, 1214, which are configured to control the voltage across the gate and source terminals of N-channel field effect transistor 1216. The output of inverter 1204 is electrically coupled to the gates of P-channel and N-channel field effect transistors 1218, 1220, which are configured to control the voltage across the gate and source terminals of N-channel field effect transistor 1222. When signal INP is in its high state, transistor 1212 is in its conductive state, and transistor 1214 is in its non-conductive state, so that the gate-to-source voltage of transistor 1216 is essentially zero, and transistor 1216 is in its non-conductive state. On the other hand, when signal INP is in its low state, transistor 1212 is in its non-conductive state, and transistor 1214 is in its conductive state, such that gate-to-source voltage of transistor 1216 is essentially equal to Vcc-Vss, and transistor 1216 is in its conductive state. Transistors 1218, 1220, and 1222 operate in an analogous manner in response to signal INN.

Complementary current signals 1208, 1210 are electrically coupled to a load circuit 1224 in the Vbst/Vx power supply domain, which is adapted to generate complementary output voltage signals OUTP, OUTN in response to current signals 1208, 1210. Load circuit 1224 includes P-channel field effect transistors 1226, 1228. Transistor 1226 is electrically coupled between Vbst and transistor 1222 and is adapted to operate in its linear region, thereby limiting the magnitude of current signal 1208. Similarly, transistor 1228 is electrically coupled between Vbst and transistor 1216 and is adapted to operate in its linear region, thereby limiting the magnitude of current signal 1210.

Load circuit 1224 further includes first and second inverter circuits 1230, 1232 referenced to the Vbst/Vx power supply domain. First inverter circuit 1230 is adapted to generate output signal OUTP from current signal 1208, while second inverter circuit 1232 is adapted to generate signal OUTN from current signal 1210. Inverter 1230 includes a P-channel field effect high side transistor 1234 and an N-channel field effect low side transistor 1236. Transistor 1234 is electrically coupled between a high side rail S2 of the inverter and an output node 1238, and transistor 1236 is electrically coupled between output node 1238 and Vx. The gates of transistors 1234, 1236 are electrically coupled to drains of transistors 1222, 1226, which are connected to a high side rail S1 of inverter circuit 1232. Similarly, inverter circuit 1232 includes a P-channel field effect high side transistor 1240 and an N-channel field effect low side transistor 1242. Transistor 1240 is electrically coupled between the high side rail S1 of the inverter and an output node 1244, and transistor 1242 is electrically coupled between output node 1244 and Vx. The gates of transistors 1240, 1242 are electrically coupled to the drains of transistors 1216, 1228, which are connected to inverter circuit 1230 high side rail S2.

High side rail S2 of inverter circuit 1230 is electrically coupled to Vbst by a P-channel field effect transistor 1246, and high side rail S1 of inverter circuit 1232 is electrically coupled to Vbst by a P-channel field effect transistor 1248. Transistors 1246 and 1248 are cross-coupled, in that the gate of transistor 1246 is electrically coupled to the drain of transistor 1248, and the gate of transistor 1248 is electrically coupled to the drain of transistor of 1246. The gate of transistor 1246 is electrically coupled to high side rail S1 of inverter circuit 1232, and the gate of transistor 1248 is electrically coupled to the high side rail S2 of inverter circuit 1230. Cross-connected transistors 1246, 1248 achieve regenerative feedback, thereby promoting fast switching of high side rails S1, S2 and corresponding fast operation of level shifter 1200.

Inverter circuits 1230 are 1232 are skewed in the sense that high side transistors 1234, 1240 are "stronger" than low side transistors 1236, 1242. Specifically, high transistor 1234 is operable to pull output node 1238 up to at least fifty percent of the electrical potential on high side rail S2 when low side transistor 1236 is in its conductive state. Similarly, high side transistor 1240 is operable to pull up output node 1244 to at least fifty percent of the electrical potential on high side rail S1 when low side transistor 1242 is in its conductive state. Such skewing of inverter circuits 1230, 1232 is required to achieve proper operation in certain situations.

For example, consider the situation where INP is asserted. Transistor 1222 will be in its conductive state, and transistor 1216 will be in its non-conductive state, such that high side rail S1 will be pulled down close to Vss and high side rail S2 will be pulled up close to Vbst. Thus, high side transistor 1234 will operate in its conductive state and low side transistor 1236 will operate in its non-conductive state, such that output signal OUTP is high. On the other hand, high side transistor 1240 will operate in its non-conductive state and low side transistor 1242 will operate in its conductive state, such that output signal OUTN is low. However, if the electrical potential of switching node Vx drops below the electrical potential of reference power node Vss, such as due to freewheeling action of freewheeling switching device 330, it will not be possible to turn low side transistor 1236 off, since its gate to source voltage will be positive. Thus, inverter circuit 1230 is skewed such that high side transistor 1234 can pull-up output node 1238 even when low side transistor 1236 is in its conductive state, to allow inverter circuit 1230 to change its output state from low to high when Vx is at a negative electrical potential with respect to Vss. Inverter circuit 1232 is skewed for similar reasons, i.e., to allow inverter to change its output state from low to high when Vx is at a negative electrical potential with respect to Vss.

Load circuit 1224 further includes diodes 1250, 1252. The anode of diode 1250 is electrically coupled to Vx, and the cathode of diode 1250 is electrically coupled to high side rail S1. The anode of diode 1252 is electrically coupled to Vx, and the cathode of diode 1252 is electrically coupled to high side rail S2. Diodes 1250, 1252 clamp any voltage swing across transistors 1226, 1228, thereby helping protect these transistors from transient voltage excursions.

Transistors 1222, 1216 also help speed switching of level shifter 1200 in certain circumstances. For example, consider again the scenario where signal INP is high and signal INN is low. As discussed above, transistors 1222, 1234, and 1242 will be in their conductive states, and transistors 1216, 1236, and 1240 will be in their non-conductive states, such that signal OUTP is high and signal OUTN is low. In some cases, Vx will be at negative electrical potential with respect to Vss, result in Vbst being at negative electrical potential with respect to Vcc. Accordingly, the drain of transistor 1216 will be at a lower electrical potential than its gate, resulting in transistor 1216 conditionally switching from its non-conductive state to its conductive state when its gate-to-drain voltage exceeds a threshold value Vth, which is typically around 0.4 volts. This conduction of transistor 1216 will cause current to flow from Vcc through transistors 1212, 1216 to rail S2, thereby pulling-up up rail S2 above Vbst by about the difference between a diode voltage and Vth, which speeds switching of inverter circuit 1230. High side rail S2 cannot be pulled more than about a diode voltage (approximately 0.7 volts) above Vbst due to a drain-source body diode (not shown) of transistor 1246 clamping rail S2 to Vbst. Conduction of transistor 1222 speeds up switching of inverter circuit 1232 in a similar manner when Vx is negative.

Level shifter 1200 may achieve one or more advantages that may not be realized by conventional level shifters. For example, certain embodiments of level shifter 1200 are fast, or in other words, introduce minimal propagation delay when converting complementary input signals INP, INN to complementary output signals OUTP, OUTN. For instance, in certain embodiments, the propagation delay is less than 7 nanoseconds, even in situations where the electrical potential of Vx is below that of Vss. This relative speed of level shifter 1200 is due to, in part, incorporation of cross-coupled transistors 1246, 1248, as well as the fact that transistors 1216, 1222 promote fast switching when Vx is negative with respect to Vss, as discussed above. Fast operation is important, for example, to prevent simultaneous conduction of control and freewheeling switching devices 328, 300, sometimes referred to as "shoot through," due to delays in switching control switching device 328.

As another example, certain embodiments of level shifter 1200 are operable when both Vcc-Vss and Vbst-Vx are as low as one volt, thereby potentially enabling operation at low input voltages. Furthermore, the fact that level shifter 1200 uses differential signals, such as complementary current signals 1208, 1210, helps reject common mode transients between the Vcc/Vss and Vbst/Vx domains.

Figure 13:
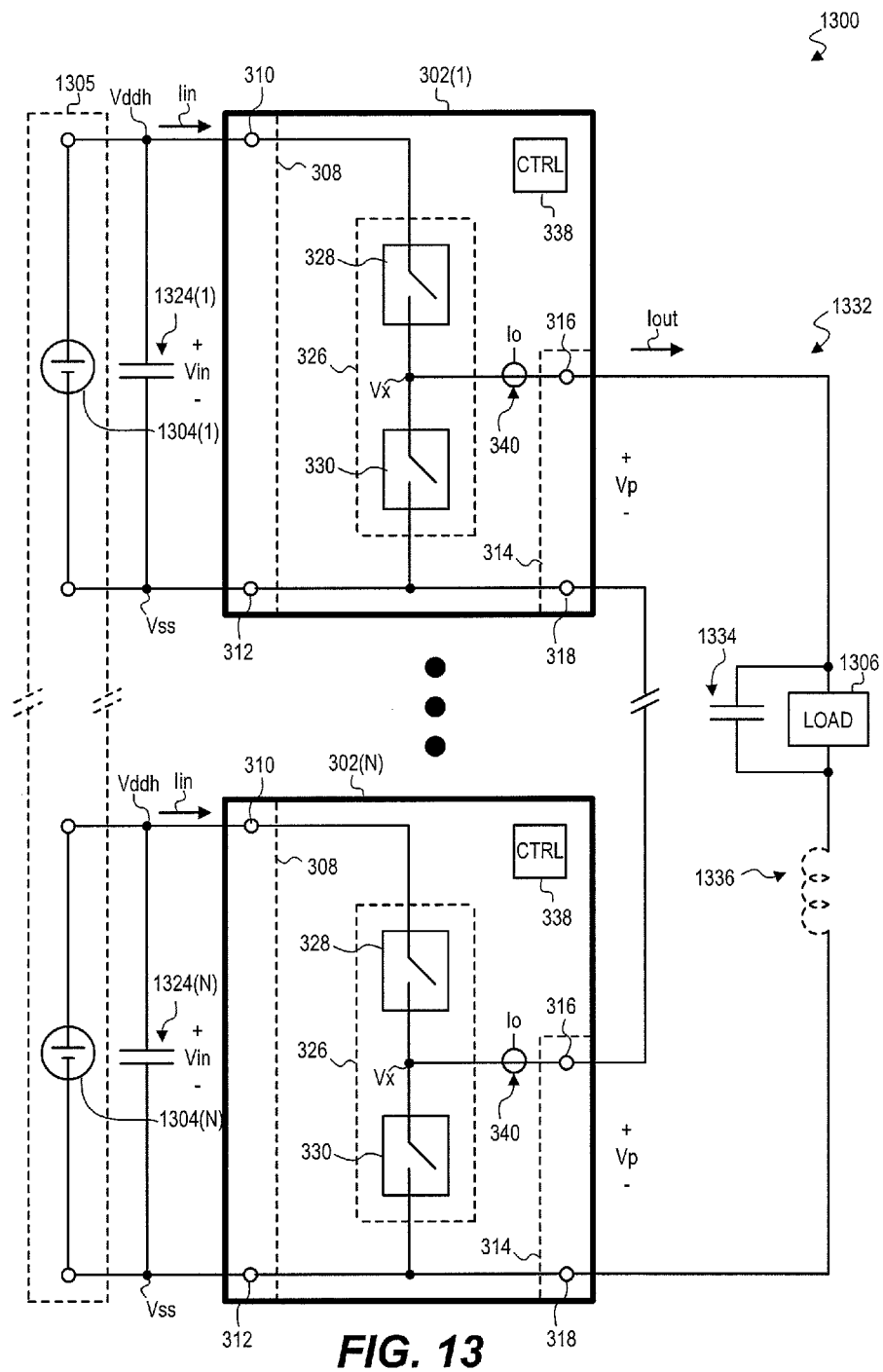
FIG. 13 illustrates an electric power system including multiple instances of the FIG. 3 MPPT controller, according to an embodiment.

Multiple instances of MPPT controller 302 can be electrically coupled together. For example, FIG. 13 illustrates an electric power system 1300 including N instances of MPPT controller 302 in a photovoltaic application, where N is an integer greater than one. In this document, specific instances of an item may be referred to by use of a numeral in parentheses (e.g., MPPT controller 302(1)) while numerals without parentheses refer to any such item (e.g., MPPT controllers 302).

The input port 308 of each MPPT controller 302 is electrically coupled to a respective photovoltaic device 1304 of a common photovoltaic module 1305. Photovoltaic devices 1304 are, for example, single photovoltaic cells or groups of electrically interconnected photovoltaic cells. However, the configuration of photovoltaic devices 1304 can be varied without departing from the scope hereof. For example, in some alternate embodiments, photovoltaic devices 1304 are discrete photovoltaic devices and are not part of a common module. As another example, in some other embodiments, two or more photovoltaic devices 1304 have different configurations. A respective input capacitor 1324 is also electrically coupled across each input port 308.

Output ports 314 of MPPT controllers 1302 are electrically coupled in series with a load 1306. One or more output capacitors 1334 are electrically coupled across load 1306 and are shared by each of the N MPPT controllers 1302. However, in some alternate embodiments, load 1306 contains significant capacitance and capacitors 1334 are therefore omitted. Additionally, in some other alternate embodiments, each MPPT controller 302 has a respective capacitor (not shown) electrically coupled across its output port 314.

MPPT controllers 302 use interconnection inductance 1336 of an output circuit 1332 electrically coupling switching circuits 326 to load 1306 as energy storage inductance. Although this interconnection inductance is symbolically shown as a single element, it is actually distributed along a loop forming output circuit 1332. Some alternate embodiments, however, include one or more discrete inductors (not shown) electrically coupled in series with output circuit 1332. For example, each MPPT controller 302 is typically required to have a respective discrete inductor electrically coupled in series with its output port 314 in embodiments where each MPPT controller 302 has a respective capacitor electrically coupled across its output port 314.

Each MPPT controller 302 essentially operates in the same manner as discussed with respect to electric power systems including a single MPPT controller 302 instance. For example, each MPPT controller 302 regulates a voltage Vin across its input port 308 to maximize power extracted from its respective photovoltaic device 304. In some embodiments, MPPT controllers 302 operate out of phase with respect to each other to prevent constructive interference of transients resulting from switching circuit 326 operation.

MPPT controller 302 can be modified such that position of its control and freewheeling switching devices are swapped. For example, MPPT controller 302 could be modified such that switching device 330 is a control switching device and switching device 328 is a freewheeling device, thereby allowing the control switching device to be driven without a bootstrap circuit. As a result of this modification, output port 314 would be electrically coupled across switching device 328 instead of across switching device 330.

Combinations of Features

Features described above as well as those claimed below may be combined in various ways without departing from the scope hereof. The following examples illustrate some possible combinations:

(A1) A maximum power point tracking controller may include an input port for electrically coupling to an electric power source, an output port for electrically coupling to a load, a control switching device, and a control subsystem. The control switching device may be adapted to repeatedly switch between its conductive and non-conductive states to transfer power from the input port to the output port. The control subsystem may be adapted to control switching of the control switching device to regulate a voltage across the input port, based at least in part on a signal representing current flowing out of the output port, to maximize a signal representing power out of the output port.

(A2) In the maximum power point tracking controller denoted as (A1), the control subsystem may be further adapted to control switching of the control switching device based partially on the signal representing current flowing out of the output port and a difference between the voltage across the input port and a reference voltage.

(A3) In the maximum power point tracking controller denoted as (A2), the control subsystem may be further adapted to vary a magnitude of the reference voltage to maximize the signal representing power out of the output port.

(A4) In either of the maximum power point tracking controllers denoted as (A2) or (A3), the control subsystem may be further adapted to control switching of the control switching device based partially on an error signal given by $-K_v*(V_{in}-V_{ref})+K_i*I_o$, where Kv is a first scaling factor, Ki is a second factor, Vin is the voltage across the input port, Vref is the reference voltage, and Io is the signal representing current flowing out of the output port.

(A5) In any of the maximum power point tracking controllers denoted as (A2) through (A4), the control subsystem may include a multiplier adapted to determine the signal representing power out of the output port from a product of a scaled signal representing average voltage across the output port and a scaled signal representing average current flowing out of the output port.

(A6) In the maximum power point tracking controller denoted as (A5), the control subsystem may further include: (a) a voltage scaling subsystem adapted to generate the scaled signal representing average voltage across the output port by scaling a signal representing average voltage across the output power port to be within a first predetermined range; and (b) a current scaling subsystem adapted to generate the scaled signal representing average current flowing out of the output port by scaling a signal representing average current flowing out the output port to be within a second predetermined range.

(A7) In the maximum power point tracking controller denoted as (A6), the current scaling subsystem may be further adapted to prevent a magnitude of the scaled signal representing average current flowing out of the output port from falling below a minimum threshold value.

(A8) In the maximum power point tracking controller denoted as (A7), the current scaling subsystem may be further adapted to add a positive offset value to the scaled signal representing average current flowing out of the output port when the signal representing average current flowing out the output port is within a range of values.

(A9) In any of the maximum power point tracking controllers denoted as (A6) through (A8), the control subsystem may further include a current filter subsystem adapted to generate the signal representing average current flowing out of the output port by filtering the signal representing current flowing out the output port.

(A10) In any of the maximum power point tracking controllers denoted as (A6) through (A10), the control subsystem may further include a voltage filter subsystem adapted to generate the signal representing average voltage across the output port by filtering a signal representing voltage across the output port.

(A11) In any of the maximum power point tracking controllers denoted as (A2) through (A10), the control subsystem may be further adapted to inhibit a reduction in the magnitude of the reference voltage when the voltage across the input port falls below a second threshold value.

(A12) In any of the maximum power point tracking controllers denoted as (A2) through (A10), the control subsystem may be further adapted to inhibit a reduction in the magnitude of the reference voltage when doing so would cause the voltage across the input port to fall below a third threshold value.

(A13) In any of the maximum power point tracking controllers denoted as (A2) through (A12), the control subsystem may be further adapted to inhibit an increase in the magnitude of the reference voltage when the voltage across the input port rises above a fourth threshold value.

(A14) In any of the maximum power point tracking controllers denoted as (A2) through (A13), the control subsystem may be further adapted to: (a) change the magnitude of the reference voltage by a first step size, to maximize the signal representing power out of the output port, when a command to control a duty cycle of the control switching device is below a fifth threshold value; and (b) change the magnitude of the reference voltage by a second step size, to maximize the signal representing power out of the output port, when a command to control a duty cycle of the control switching device is greater than or equal to a sixth threshold value; where the second step size is smaller than the first step size.

(A15) In the maximum power point tracking controller denoted as (A14), the fifth threshold value may be the same as the sixth threshold value.

(A16) In any of the maximum power point tracking controllers denoted as (A2) through (A15), the control subsystem may be further adapted to: (a) change the magnitude of the reference voltage by a third step size, to maximize the signal representing power out of the output port, when a difference in the signal representing power out of the output port between successive changes in magnitude of the reference voltage is below a seventh threshold value; and (b) change the magnitude of the reference voltage by a fourth step size, to maximize the signal representing power out of the output port, when a difference in the signal representing power out of the output port between successive changes in magnitude of the reference voltage is greater than or equal to a eight threshold value; where the fourth step size is greater than the third step size.

(A17) In the maximum power point tracking controller denoted as (A16), the seventh threshold value may be the same as the eighth threshold value.

(A18) In any of the maximum power point tracking controllers denoted as (A2) through (A17), the control subsystem may be further adapted to: (a) change the magnitude of the reference voltage at a first rate, to maximize the signal representing power out of the output port, when a command to control a duty cycle of the control switching device is within a first range of values; and (b) change the magnitude of the reference voltage at a second rate, to maximize the signal representing power out of the output port, when the command to control the duty cycle of the control switching device is within a second range of values; where the second rate is greater than the first rate.

(A19) In the maximum power point tracking controller denoted as (A18), the first range of values may represent a command that the duty cycle of the control switching device be between zero and one hundred percent, and the second range of values may represent a command that the duty cycle of the control switching device be less than zero or greater than one hundred percent.

(A20) In any of the maximum power point tracking controllers denoted as (A2) through (A19), the control subsystem may be further adapted to increase the magnitude of the reference voltage in response to the magnitude of the voltage across the input port falling below a ninth threshold value.

(A21) In any of the maximum power point tracking controllers denoted as (A2) through (A21), the control subsystem may be further adapted to set an initial magnitude of the reference voltage based at least partially on an initial value of the voltage across the input port, at start-up of the switching circuit.

(A22) In the maximum power point tracking controller denoted as (A21), the control subsystem may be further adapted to set the initial magnitude of the reference voltage to a fraction of the voltage across the input port, at start-up of the switching circuit.

(A23) In any of the maximum power point tracking controllers denoted as (A2) through (A22), the control subsystem may be further adapted to decrease the magnitude of the reference voltage in response to the signal representing current flowing out of the output port indicating that a magnitude of current flowing out of the output port has fallen below a tenth threshold level.

(A24) In the maximum power point tracking controller denoted as (A23), the control subsystem may be further adapted to operate the control switching device at a fixed duty cycle in response to the signal representing current flowing out of the output port indicating that a magnitude of current flowing out of the output port has fallen below an eleventh threshold level, where the eleventh threshold level is lower than the tenth threshold level.

(A25) In any of the maximum power point tracking controllers denoted as (A1) through (A24), the control switching device may be electrically coupled between a first terminal of the input port and a first terminal of the output port, and the maximum power point tracking controller may further include a freewheeling device electrically coupled between the first terminal of the output port and a second terminal of the output port, where the freewheeling device is adapted to provide a path for current flowing between the first and second terminals of the output port when the control switching device is in its non-conductive state.

(A26) In any of the maximum power point tracking controllers denoted as (A1) through (A25), the control switching device and the control subsystem may be part of a common integrated circuit.

(A27) In any of the maximum power point tracking controllers denoted as (A1) through (A26): (a) the control switching device may include a dynamically sized field effect transistor; (b) the maximum power point tracking controller may further include a current reconstructor subsystem adapted to generate the signal representing current flowing out of the output port, where the current reconstructor subsystem has a gain at least partially dependent on a size of the dynamically sized field effect transistor; and (c) the control subsystem may be adapted to decrease a size of the dynamically sized field effect transistor if a magnitude of the signal representing current flowing out of the output port falls below a twelfth threshold value, thereby increasing the gain of the current reconstructor subsystem.

(B1) An electric power system may include an electric power source and a maximum power point tracking controller. The maximum power point tracking controller may include an input port for electrically coupled to the electric power source, an output port for electrically coupling to a load, a control switching device, and a control subsystem. The control switching device may be adapted to repeatedly switch between its conductive and non-conductive states to transfer power from the input port to the output port. The control subsystem may be adapted to control switching of the control switching device to regulate a voltage across the input port, based at least in part on a signal representing current flowing out of the output port, to maximize a signal representing power out of the output port.

(B2) In the electric power system denoted as (B1), the electric power source may include a photovoltaic device.

(B3) In the electric power system denoted as (B2), the photovoltaic device may include a plurality of interconnected photovoltaic cells.

(B4) In either of the electric power systems denoted as (B2) or (B3), the photovoltaic device may include a multi-junction photovoltaic cell.

(B5) In any of the electric power systems denoted as (B1) through (B4), the control subsystem may be adapted to control switching of the control switching device based partially on the signal representing current flowing out of the output port and a difference between the voltage across the input port and a reference voltage.

(B6) In the electric power system denoted as (B5), the control subsystem may be further adapted to vary a magnitude of the reference voltage to maximize the signal representing power out of the output port.

(B7) In either of the electric power systems denoted as (B5) or (B6) the control subsystem may be further adapted to control switching of the control switching device based partially on an error signal given by $-Kv^*(Vin-Vref)+Ki^*Io$, where Kv is a first scaling factor, Ki is a second scaling factor, Vin is the voltage across the input port, Vref is the reference voltage, and Io is the signal representing current flowing out of the output port.

(B8) In any of the electric power systems denoted as (B1) through (B7), the control switching device may be electrically coupled between a first terminal of the input port and a first terminal of the output port, and the maximum power point tracking controller may further include a freewheeling device electrically coupled between the first terminal of the output port and a second terminal of the output port, where the freewheeling device is adapted to provide a path for current flowing between the first and second terminals of the output port when the control switching device is in its non-conductive state.

(B9) In any of the electric power systems denoted as (B1) through (B8), the control subsystem may include a multiplier adapted to determine the signal representing power out of the output port from a product of a scaled signal representing average voltage across the output port and a scaled signal representing average current flowing out of the output port.

(B10) In the electric power system denoted as (B9), the control subsystem may be further adapted to prevent a magnitude of the scaled signal representing average current flowing out of the output port from falling below a minimum threshold value.

(B11) In any of the electric power systems denoted as (B1) through (B10), the control switching device and the control subsystem may be part of a common integrated circuit.

(B12) In the electric power system denoted as (B11), the common integrated circuit and the photovoltaic device may be co-packaged.

(B13) Any of the electric power systems denoted as (B1) through (B12) may further include one or more additional maximum power point tracking controllers electrically coupled in series with the output port and the load, where each additional maximum power point tracking controller is adapted to transfer power from a respective additional electric power source to the load.

(C1) A method for operating a maximum power point tracking controller including an input port for electrically coupled to an electric power source and an output port for electrically coupling to a load may include the steps of: (a) repeatedly switching a control switching device of the maximum power point tracking controller between its conductive and non-conductive states to transfer power from the input port to the output port; and (b) controlling switching of the control switching device, based at least in part on a signal representing current flowing out of the output port, to regulate a magnitude of a voltage across the input port such that a signal representing power out of the output port is maximized.

(C2) The method denoted as (C1) may further include controlling switching of the control switching device partially based on the signal representing current flowing out of the output port and a difference between the magnitude of the voltage across the input port and a reference voltage.

(C3) The method denoted as (C2) may further include varying a magnitude of the reference voltage to maximize the signal representing power out of the output port.

(C4) Either of the methods denoted as (C2) or (C3) may further include controlling switching of the control switching device partially based on an error signal given by $-Kv^*(Vin-Vref)+Ki^*Io$, where Kv is a first scaling factor, Ki is a second scaling factor, Vin is the voltage across the input port, Vref is the reference voltage, and Io is the signal representing current flowing out of the output port.

(C5) Any of the methods denoted as (C2) through (C4) may further include determining the signal representing power out of the output port by multiplying a signal representing average voltage across the output port by a signal representing average current flowing out of the output port, using a multiplier.

(C6) The method denoted as (C5) may further include filtering the signal representing current flowing out of the output port to generate the signal representing average current flowing out of the output port.

(C7) Either of the methods denoted as (C5) or (C6) may further include filtering a signal representing voltage across the output port to generate the signal representing average voltage across the output power port.

(C8) Any of the methods denoted as (C5) through (C7) may further include preventing a magnitude of the signal representing average current flowing out of the output port from falling below a minimum threshold value.

(C9) Any of the methods denoted as (C2) through (C8) may further include: (a) storing a first sample of the signal representing power out of the output port when a duty cycle of the control switching device is one hundred percent duty cycle; (b) decreasing the magnitude of the reference voltage by a first amount; (c) storing a second sample of the signal representing power out of the output port, after the step of decreasing the magnitude of the reference voltage by the first amount;

(d) comparing the first sample of the signal representing power out of the output port to the second sample of the signal representing power out of the output port; (e) increasing the magnitude of the reference voltage when the first sample of the signal representing power out of the output port is greater than the second sample of the signal representing power out of the output port; and (f) decreasing the magnitude of the reference voltage when the second sample of the signal representing power out of the output port is greater than the first sample of the signal representing power out of the output port.

(C10) Any of the methods denoted as (C2) through (C9) may further include inhibiting a reduction in the magnitude of the reference voltage when the voltage across the input port falls below a second threshold value.

(C11) Any of the methods denoted as (C2) through (C10) may further include inhibiting an increase in the magnitude of the reference voltage when the voltage across the input port rises above a third threshold value.

(C12) Any of the methods denoted as (C2) through (C11) may further include: (a) changing the magnitude of the reference voltage by a first step size, to maximize the signal representing power out of the output port, when a command to control a duty cycle of the control switching device is below a fourth threshold value; and (b) changing the magnitude of the reference voltage by a second step size, to maximize the signal representing power out of the output port, when a command to control a duty cycle of the control switching device is greater than or equal to a fifth threshold value; where the second step size is smaller than the first step size.

(C13) Any of the methods denoted as (C2) through (C11) may further include: (a) changing the magnitude of the reference voltage at a first rate, to maximize the signal representing power out of the output port, when a command to control a duty cycle of the control switching device is within a first range of values; and (b) changing the magnitude of the reference voltage at a second rate, to maximize the signal representing power out of the output port, when the command to control the duty cycle of the control switching device is within a second range of values; where the second rate being greater than the first rate.

(C14) In the method denoted as (C13), the first range of values may represent that the duty cycle of the control switching device is commanded to be between zero and one hundred percent, and the second range of values may represent that the duty cycle of the control switching device is commanded to be less than zero or greater than one hundred percent.

(C15) Any of the methods denoted as (C2) through (C14) may further include increasing the magnitude of the reference voltage in response to the magnitude of the voltage across the input port falling below a sixth threshold value.

(C16) Any of the methods denoted as (C2) through (C15) may further include setting an initial magnitude of the reference voltage based at least partially on an initial value of the voltage across the input port, at start-up of the switching circuit.

(C17) The method denoted as (C16) may further include setting the initial magnitude of the reference voltage to a fraction of the voltage across the input port, at start-up of the switching circuit.

(C18) Any of the methods denoted as (C2) through (C17) may further include decreasing the magnitude of the reference voltage in response to a magnitude of current flowing out of the output port falling below a seventh threshold level.

(C19) The method denoted as (C18) may further include operating the control switching device at a fixed duty cycle in response to a magnitude of current flowing out of the output port falling below a eighth threshold level, where the eighth threshold level is lower than the seventh threshold level.

(C20) Any of the methods denoted as (C1) through (C19) may further include: (a) generating the signal representing current flowing out of the output port using a current reconstructor subsystem; and (b) decreasing a size of a dynamically sized field effect transistor of the control switching device when a magnitude of the signal representing current flowing out of the output port falls below a ninth threshold value, thereby increasing a gain of the current reconstructor subsystem.

(D1) An electronic filter may include: (a) an integrator subsystem adapted to operate in a bipolar domain to filter an alternating current component of an input signal; and (b) transconductance circuitry adapted to operate in a unipolar domain to generate an output current signal proportional to an average value of the input current signal.

(D2) In the electronic filter denoted as (D1): the integrator subsystem may be adapted to generate an integrator signal representing the average value of the input current signal; and (b) the transconductance circuitry may include a first transconductance amplifier adapted to generate the output current signal, from the integrator signal.

(D3) In the electronic filter denoted as (D2), the transconductance circuitry may further include a second transconductance amplifier adapted to generate a direct current component of the input current signal, from the integrator signal.

(D4) In any of the electronic filters denoted as (D1) through (D3), the integrator subsystem may include: (a) an integrator having an inverting input terminal and a non-inverting input terminal, and (b) a resistive device electrically coupled across the input terminals of integrator; where the non-inverting input terminal of the integrator is electrically coupled to a reference node of the electronic filter via a voltage source, the inverting input terminal of the integrator is electrically coupled to a first node, and the electronic filter is arranged such that the input current signal flows out of the first node.

(E1) A signal scaling system may include (a) a transconductance subsystem adapted to convert an input voltage signal to an output current signal, the transconductance subsystem including a programmable resistor adapted to set a gain of the transconductance subsystem; and (b) control logic adapted to set a resistance of the programmable resistor to adjust the gain of the transconductance subsystem such that a magnitude of the output current signal is at least as large as a first threshold value.

(E2) In the signal scaling system denoted as (E1) the transconductance subsystem may further include: (a) a transistor electrically coupled to the programmable resistor; and (b) an amplifier adapted to control the transistor to regulate a voltage across the programmable resistor in response to the input voltage signal.

(E3) In either of the signal scaling systems denoted as (E1) or (E2), the control logic may be further adapted to set a gain of the transconductance subsystem to a minimum value in response to a first external signal.

(E4) In any of the signal scaling systems denoted as (E1) through (E3), the control logic may be further adapted to increment the gain of the transconductance subsystem in response to a second external signal, until the magnitude of the output current signal is at least as large as the first threshold value.

(E5) In any of the signal scaling systems denoted as (E1) through (E4), the control logic may be further adapted to detect when the magnitude of the output current signal exceeds a second threshold value, where the second threshold value is greater than the first threshold value.

(E6) In the signal scaling system denoted as (E5), the control logic may be further adapted to generate a signal indicating that the magnitude of the output current signal exceeds the second threshold value.

(E7) In any of the signal scaling systems denoted as (E1) through (E6), the transconductance system may further include a current mirror adapted to generate the output current signal in response to current flowing through the programmable resistor.

(F1) A signal level shifter for shifting complementary input voltage signals in a first power supply domain to complementary output voltage signals in a second power supply domain may include: (a) a transconductance stage in the first power supply domain adapted to generate complementary current signals in response to the complementary input voltage signals; and (b) a load circuit in the second power supply domain adapted to generate the complementary output voltage signals in response to the complementary current signals, where the load circuit includes first and second inverter circuits adapted to generate the complementary output voltage signals in response to the complementary current signals.

(F2) In the signal level shifter denoted as (F1): a high side rail of the first inverter circuit may be electrically coupled to a high side rail of the second power supply domain by a first transistor; a high side rail of the second inverter circuit may be electrically coupled to the high side rail of the second power supply domain by a second transistor; and the first and second transistors may be cross-coupled.

(F3) In the signal level shifter denoted as (F2), each of the inverter circuits may include: (a) a high side transistor electrically coupled between the high side rail of the inverter circuit and an output node of the inverter circuit; and (b) a low side transistor electrically coupled between the output node of the inverter circuit and a reference rail of the second power supply domain; where the high side transistor is operable to pull the output node of the inverter circuit up to at least fifty percent of an electrical potential of the high side rail of the inverter, with respect to the reference rail of the second power supply domain, when the low side transistor is in its conductive state.

(F4) In either of the signal level shifters denoted as (F2) or (F3), the transconductance stage may be operable to drive current into the high side rails of the first and second inverter circuits, when an electrical potential of a reference rail of the second power supply domain is below an electrical potential of a reference rail of the first power supply domain.

(G1) A system for determining a signal representing power in a maximum power point tracking (MPPT) controller may include: (a) a voltage filter subsystem adapted to generate a signal representing average voltage across an output port of the MPPT controller by filtering a signal representing voltage across the output port; (b) a current filter subsystem adapted to generate a signal representing average current flowing out of the output port by filtering a signal representing current flowing out the output port; (c) a voltage scaling subsystem adapted to generate a scaled signal representing average voltage across the output port by scaling the signal representing average voltage across the output port to be within a first predetermined range; (d) a current scaling subsystem adapted to generate a scaled signal representing average current flowing out of the output port by scaling the signal representing average current flowing out the output port to be within a second predetermined range; and (e) a multiplier adapted to determine the signal representing power from a product of the scaled signal representing average voltage across the output port and the scaled signal representing average current flowing out of the output port.

(G2) In the system denoted as (G1), the multiplier may include: (a) a first input port adapted to receive the scaled signal representing average voltage across the output port; (b) a second input port adapted to receive the scaled signal representing average current flowing out of the output port; (c) an output port adapted to provide the signal representing power; (d) a first field effect transistor electrically coupled in series with the first input port; (e) a second field effect transistor electrically coupled in series with the second input port; (f) a third field effect transistor electrically coupled in series with the output port; and (g) control circuitry adapted to control each of the first, second, and third field effect transistors such that a magnitude of current flowing into the output port is proportional to a product of (1) a magnitude of current flowing into the first input port, and (2) a magnitude of current flowing into the second input port.

(G3) In the system denoted as (G2), a gate of the first field effect transistor may be electrically coupled to a gate of the third field effect transistor.

(G4) The system denoted as (G3) may further include: (a) fourth and fifth field effect transistors forming a current mirror configured such that a magnitude of a drain-to-source current flowing through the fifth field effect transistor is equal to Iref, and a magnitude of a drain-to-source current flowing through the fourth field effect transistor is equal to Iref/m; and (b) a first amplifier adapted to control the gate of the first field effect transistor such that a voltage across the first field effect transistor is equal to a voltage across the fourth field effect transistor.

(G5) In the system denoted as (G4), a gate of the second field effect transistor may be electrically coupled to a gate of the fourth field effect transistor and a gate of the fifth field effect transistor.

(G6) In either of the systems denoted as (G4) or (G5), the second field effect transistor may have a channel resistance equal to R/m, and the fourth and fifth field effect transistors may each have a channel resistance equal to R, when the second, fourth, and fifth transistors are driven by a common gate-to-source voltage.

(G7) Any of the systems denoted as (G2) through (G6) may further include a second amplifier and a sixth transistor configured to control the magnitude of current flowing into the output port such that a voltage across the second field effect transistor is equal to a voltage across the third field effect transistor.

(G8) In any of the systems denoted as (G1) through (G7), the current scaling subsystem may include: (a) a transconductance subsystem adapted to convert the signal representing average current flowing out the output port to the scaled signal representing average current flowing out of the output port, the transconductance subsystem including a programmable resistor adapted to set a gain of the transconductance subsystem; and (b) control logic adapted to set a resistance of the programmable resistor to adjust the gain of the transconductance subsystem such that a magnitude of the scaled signal representing average current flowing out of the output port is at least as large as a first threshold value.

(G9) In the system denoted as (G8), the transconductance subsystem may further include: (a) a transistor electrically coupled to the programmable resistor; and (b) an amplifier adapted to control the transistor to regulate a voltage across the programmable resistor in response to the signal representing average current flowing out of the output port.

(G10) In either of the systems denoted as (G8) or (G9), the control logic may be further adapted to set a gain of the transconductance subsystem to a minimum value in response to a first external signal.

(G11) In any of the systems denoted as (G8) through (G10), the control logic may be further adapted to increment the gain of the transconductance subsystem in response to a second external signal, until the magnitude of the scaled signal representing current flowing out of the output port is at least as large as the first threshold value.

(G12) In any of the systems denoted as (G8) through (G11), the transconductance subsystem may further include a current mirror adapted to generate the scaled signal representing average current flowing out of the output port in response to current flowing through the programmable resistor.

(G13) In any of the systems denoted as (G1) through (G12), the current filter subsystem may include: (a) an integrator subsystem adapted to operate in a bipolar domain to filter an alternating current component of the signal representing current flowing out the output port; and (b) transconductance circuitry adapted to operate in a unipolar domain to generate the signal representing average current flowing out of the output port from an average value of the signal representing current flowing out the output port.

(G14) In the system denoted as (G13): the integrator subsystem may be adapted to generate an integrator signal representing the average value of the signal representing current flowing out the output port; and the transconductance circuitry may include a first transconductance amplifier adapted to generate the signal representing average current flowing out of the output port, from the integrator signal.

(G15) In the system denoted as (G14), the transconductance circuitry may further include a second transconductance amplifier adapted to generate a direct current component of the signal representing current flowing out the output port, from the integrator signal.

(G16) In any of the systems denoted as (G13) through (G15), the integrator subsystem may include: (a) an integrator having an inverting input terminal and a non-inverting input terminal; and (b) a resistive device electrically coupled across the input terminals of integrator; the non-inverting input terminal of the integrator being electrically coupled to a reference node via a voltage source, the inverting input terminal of the integrator being electrically coupled to a first node, and the current filter subsystem arranged such that the signal representing current flowing out the output port flows out of the first node.

(H1) A multiplier may include: (a) a first and a second input port; (b) an output port; (c) a first field effect transistor electrically coupled in series with the first input port; (d) a second field effect transistor electrically coupled in series with the second input port; (e) a third field effect transistor electrically coupled in series with the output port; and (f) control circuitry adapted to control each of the first, second, and third field effect transistors such that a magnitude of current flowing into the output port is proportional to a product of (1) a magnitude of current flowing into the first input port, and (2) a magnitude of current flowing into the second input port.

(H2) In the multiplier denoted as (H1), a gate of the first field effect transistor may be electrically coupled to a gate of the third field effect transistor.

(H3) Either of the multipliers denoted as (H1) or (H2) may further include: (a) fourth and fifth field effect transistors forming a current mirror configured such that a magnitude of a drain-to-source current flowing through the fifth field effect transistor is equal to Iref, and a magnitude of a drain-to-source current flowing through the fourth field effect transistor is equal to Iref/m; and (b) a first amplifier adapted to control the gate of the first field effect transistor such that a voltage across the first field effect transistor is equal to a voltage across the fourth field effect transistor.

(H4) In the multiplier denoted as (H3), a gate of the second field effect transistor may be electrically coupled to a gate of the fourth field effect transistor and a gate of the fifth field effect transistor.

(H5) In either of the multipliers denoted as (H3) or (H4), the second field effect transistor may have a channel resistance equal to R/m, and the fourth and fifth field effect transistors each may have a channel resistance equal to R, when the second, fourth, and fifth transistors are driven by a common gate-to-source voltage.

(H6) Any of the multipliers denoted as (H1) through (H5) may further include a second amplifier and a sixth transistor configured to control the magnitude of current flowing into the output port such that a voltage across the second field effect transistor is equal to a voltage across the third field effect transistor.

Changes may be made in the above methods and systems without departing from the scope hereof. For example, N-channel field effect transistors could be replaced with P-channel field effect transistors, or vice versa, with appropriate changes to associated circuitry. As another example, field effect transistors could be replaced with bipolar junction transistors, with appropriate changes to associated circuitry. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A maximum power point tracking controller, comprising:
   an input port for electrically coupling to an electric power source;
   an output port for electrically coupling to a load;
   a control switching device adapted to repeatedly switch between conductive and non-conductive states to transfer power from the input port to the output port; and
   a control subsystem adapted to control switching of the control switching device to regulate a voltage across the input port, based at least in part on a signal representing current flowing out of the output port, to maximize a signal representing power out of the output port;
   the control subsystem further adapted to:
      control switching of the control switching device based partially on the signal representing current flowing out of the output port and a difference between the voltage across the input port and a reference voltage,
      vary a magnitude of the reference voltage to maximize the signal representing power out of the output port, and
      control switching of the control switching device based partially on an error signal given by −Kv*(Vin−Vref)+Ki*Io, where Kv is a first scaling factor, Ki is a second scaling factor, Vin is the voltage across the input port, Vref is the reference voltage, and Io is the signal representing current flowing out of the output port.

2. The maximum power point tracking controller of claim 1, the control switching device being electrically coupled between a first terminal of the input port and a first terminal of the output port, the maximum power point tracking controller further comprising a freewheeling device electrically coupled between the first terminal of the output port and a second terminal of the output port, the freewheeling device adapted to provide a path for current flowing between the first and second terminals of the output port when the control switching device is in its non-conductive state.

3. The maximum power point tracking controller of claim 2, the control subsystem comprising a multiplier adapted to determine the signal representing power out of the output port from a product of a scaled signal representing average voltage across the output port and a scaled signal representing average current flowing out of the output port.

4. The maximum power point tracking controller of claim 3, the control subsystem further comprising:
 a voltage scaling subsystem adapted to generate the scaled signal representing average voltage across the output port by scaling a signal representing average voltage across the output power-port to be within a first predetermined range; and
 a current scaling subsystem adapted to generate the scaled signal representing average current flowing out of the output port by scaling a signal representing average current flowing out the output port to be within a second predetermined range.

5. The maximum power point tracking controller of claim 4, the current scaling subsystem further adapted to prevent a magnitude of the scaled signal representing average current flowing out of the output port from falling below a minimum threshold value.

6. The maximum power point tracking controller of claim 5, the current scaling subsystem further adapted to add a positive offset value to the scaled signal representing average current flowing out of the output port when the signal representing average current flowing out the output port is within a first range of values.

7. The maximum power point tracking controller of claim 4, the control subsystem further comprising a current filter subsystem adapted to generate the signal representing average current flowing out of the output port by filtering the signal representing current flowing out the output port.

8. The maximum power point tracking controller of claim 7, the control subsystem further comprising a voltage filter subsystem adapted to generate the signal representing average voltage across the output port by filtering a signal representing voltage across the output port.

9. The maximum power point tracking controller of claim 1, the control subsystem further adapted to inhibit a reduction in the magnitude of the reference voltage when the voltage across the input port falls below a threshold value.

10. The maximum power point tracking controller of claim 1, the control subsystem further adapted to inhibit a reduction in the magnitude of the reference voltage when doing so would cause the voltage across the input port to fall below a threshold value.

11. The maximum power point tracking controller of claim 1, the control subsystem further adapted to inhibit an increase in the magnitude of the reference voltage when the voltage across the input port rises above a threshold value.

12. The maximum power point tracking controller of claim 1, the control subsystem further adapted to:
 change the magnitude of the reference voltage by a first step size, to maximize the signal representing power out of the output port, when a command to control a duty cycle of the control switching device is below a first threshold value; and
 change the magnitude of the reference voltage by a second step size, to maximize the signal representing power out of the output port, when a command to control a duty cycle of the control switching device is greater than or equal to a second threshold value;
 the second step size being smaller than the first step size.

13. The maximum power point tracking controller of claim 12, the first threshold value being the same as the second threshold value.

14. The maximum power point tracking controller of claim 1, the control subsystem further adapted to:
 change the magnitude of the reference voltage by a first step size, to maximize the signal representing power out of the output port, when a difference in the signal representing power out of the output port between successive changes in magnitude of the reference voltage is below a first threshold value; and
 change the magnitude of the reference voltage by a second step size, to maximize the signal representing power out of the output port, when a difference in the signal representing power out of the output port between successive changes in magnitude of the reference voltage is greater than or equal to a second threshold value;
 the second step size being greater than the first step size.

15. The maximum power point tracking controller of claim 14, the first threshold value being the same as the second threshold value.

16. The maximum power point tracking controller of claim 1, the control subsystem further adapted to:
 change the magnitude of the reference voltage at a first rate, to maximize the signal representing power out of the output port, when a command to control a duty cycle of the control switching device is within a first range of values; and
 change the magnitude of the reference voltage at a second rate, to maximize the signal representing power out of the output port, when the command to control the duty cycle of the control switching device is within a second range of values;
 the second rate being greater than the first rate.

17. The maximum power point tracking controller of claim 16, the first range of values representing a command that the duty cycle of the control switching device be between zero and one hundred percent, and the second range of values representing a command that the duty cycle of the control switching device be less than zero or greater than one hundred percent.

18. The maximum power point tracking controller of claim 1, the control subsystem further adapted to increase the magnitude of the reference voltage in response to the magnitude of the voltage across the input port falling below a threshold value.

19. The maximum power point tracking controller of claim 1, the control subsystem further adapted to set an initial magnitude of the reference voltage based at least partially on an initial value of the voltage across the input port, at start-up of the switching circuit.

20. The maximum power point tracking controller of claim 19, the control subsystem further adapted to set the initial magnitude of the reference voltage to a fraction of the voltage across the input port, at start-up of the switching circuit.

21. The maximum power point tracking controller of claim 1, the control subsystem further adapted to decrease the magnitude of the reference voltage in response to the signal representing current flowing out of the output port indicating that a magnitude of current flowing out of the output port has fallen below a first threshold level.

22. The maximum power point tracking controller of claim 21, the control subsystem further adapted to operate the control switching device at a fixed duty cycle in response to the signal representing current flowing out of the output port indicating that a magnitude of current flowing out of the output port has fallen below a second threshold level, where the second threshold level is lower than the first threshold level.

23. The maximum power point tracking controller of claim 1, the control switching device and the control subsystem being part of a common integrated circuit.

24. The maximum power point tracking controller of claim 1, wherein:
the control switching device comprises a dynamically sized field effect transistor;
the maximum power point tracking controller further comprises a current reconstructor subsystem adapted to generate the signal representing current flowing out of the output port, the current reconstructor subsystem having a gain at least partially dependent on a size of the dynamically sized field effect transistor; and
the control subsystem is adapted to decrease a size of the dynamically sized field effect transistor if a magnitude of the signal representing current flowing out of the output port falls below a threshold value, thereby increasing the gain of the current reconstructor subsystem.

25. An electric power system, comprising:
an electric power source; and
a maximum power point tracking controller, including:
an input port electrically coupled to the electric power source,
an output port for electrically coupling to a load,
a control switching device adapted to repeatedly switch between conductive and non-conductive states to transfer power from the electric power source to the output port, and
a control subsystem adapted to control switching of the control switching device to regulate a voltage across the input port, based at least in part on a signal representing current flowing out of the output port, to maximize a signal representing power out of the output port;
the control subsystem further adapted to:
control switching of the control switching device based partially on the signal representing current flowing out of the output port and a difference between the voltage across the input port and a reference voltage,
vary a magnitude of the reference voltage to maximize the signal representing power out of the output port, and
control switching of the control switching device based partially on an error signal given by $-Kv*(Vin-Vref)+Ki*Io$, where Kv is a first scaling factor, Ki is a second scaling factor, Vin is the voltage across the input port, Vref is the reference voltage, and Io is the signal representing current flowing out of the output port.

26. The electric power system of claim 25, the electric power source comprising a photovoltaic device.

27. The electric power system of claim 26, the photovoltaic device comprising a plurality of interconnected photovoltaic cells.

28. The electric power system of claim 26, the photovoltaic device comprising a multi-junction photovoltaic cell.

29. The electric power system of claim 25, the control switching device being electrically coupled between a first terminal of the input port and a first terminal of the output port, the maximum power point tracking controller further comprising a freewheeling device electrically coupled between the first terminal of the output port and a second terminal of the output port, the freewheeling device adapted to provide a path for current flowing between the first and second terminals of the output port when the control switching device is in its non-conductive state.

30. The electric power system of claim 29, the control subsystem comprising a multiplier adapted to determine the signal representing power out of the output port from a product of a scaled signal representing average voltage across the output port and a scaled signal representing average current flowing out of the output port.

31. The electric power system of claim 30, the control subsystem further adapted to prevent a magnitude of the scaled signal representing average current flowing out of the output port from falling below a minimum threshold value.

32. The electric power system of claim 26, the control switching device and the control subsystem being part of a common integrated circuit.

33. The electric power system of claim 32, the common integrated circuit and the photovoltaic device being co-packaged.

34. The electric power system of claim 25, further comprising one or more additional maximum power point tracking controllers electrically coupled in series with the output port and the load, each additional maximum power point tracking controller adapted to transfer power from a respective additional electric power source to the load.

35. A method for operating a maximum power point tracking controller including an input port for electrically coupled to an electric power source and an output port for electrically coupling to a load, comprising the steps of:
repeatedly switching a control switching device of the maximum power point tracking controller between conductive and non-conductive states to transfer power from the input port to the output port;
controlling switching of the control switching device, based at least in part on a signal representing current flowing out of the output port, to regulate a magnitude of a voltage across the input port such that a signal representing power out of the output port is maximized;
controlling switching of the control switching device partially based on the signal representing current flowing out of the output port and a difference between the magnitude of the voltage across the input port and a reference voltage;
varying a magnitude of the reference voltage to maximize the signal representing power out of the output port; and
controlling switching of the control switching device partially based on an error signal given by $-Kv*(Vin-Vref)+Ki*Io$, where Kv is a first scaling factor, Ki is a second scaling factor, Vin is the voltage across the input port, Vref is the reference voltage, and Io is the signal representing current flowing out of the output port.

36. The method of claim 35, further comprising determining the signal representing power out of the output port by multiplying a signal representing average voltage across the output port by a signal representing average current flowing out of the output port, using a multiplier.

37. The method of claim 36, further comprising filtering the signal representing current flowing out of the output port to generate the signal representing average current flowing out of the output port.

38. The method of claim 37, further comprising filtering a signal representing voltage across the output port to generate the signal representing average voltage across the output power port.

39. The method of claim 38, further comprising preventing a magnitude of the signal representing average current flowing out of the output port from falling below a minimum threshold value.

40. The method of claim 35, further comprising:
storing a first sample of the signal representing power out of the output port when a duty cycle of the control switching device is one hundred percent duty cycle;
decreasing the magnitude of the reference voltage by a first amount;
storing a second sample of the signal representing power out of the output port, after the step of decreasing the magnitude of the reference voltage by the first amount;
comparing the first sample of the signal representing power out of the output port to the second sample of the signal representing power out of the output port;
increasing the magnitude of the reference voltage when the first sample of the signal representing power out of the output port is greater than the second sample of the signal representing power out of the output port; and
decreasing the magnitude of the reference voltage when the second sample of the signal representing power out of the output port is greater than the first sample of the signal representing power out of the output port.

41. The method of claim 35, further comprising inhibiting a reduction in the magnitude of the reference voltage when the voltage across the input port falls below a threshold value.

42. The method of claim 35, further comprising inhibiting an increase in the magnitude of the reference voltage when the voltage across the input port rises above a threshold value.

43. The method of claim 35, further comprising:
changing the magnitude of the reference voltage by a first step size, to maximize the signal representing power out of the output port, when a command to control a duty cycle of the control switching device is below a first threshold value; and
changing the magnitude of the reference voltage by a second step size, to maximize the signal representing power out of the output port, when a command to control a duty cycle of the control switching device is greater than or equal to a second threshold value;
the second step size being smaller than the first step size.

44. The method of claim 35, further comprising:
changing the magnitude of the reference voltage at a first rate, to maximize the signal representing power out of the output port, when a command to control a duty cycle of the control switching device is within a first range of values; and
changing the magnitude of the reference voltage at a second rate, to maximize the signal representing power out of the output port, when the command to control the duty cycle of the control switching device is within a second range of values;
the second rate being greater than the first rate.

45. The method of claim 44, the first range of values representing that the duty cycle of the control switching device is commanded to be between zero and one hundred percent, and the second range of values representing that the duty cycle of the control switching device is commanded to be less than zero or greater than one hundred percent.

46. The method of claim 35, further comprising increasing the magnitude of the reference voltage in response to the magnitude of the voltage across the input port falling below a threshold value.

47. The method of claim 35, further comprising setting an initial magnitude of the reference voltage based at least partially on an initial value of the voltage across the input port, at start-up of the switching circuit.

48. The method of claim 47, further comprising setting the initial magnitude of the reference voltage to a fraction of the voltage across the input port, at start-up of the switching circuit.

49. The method of claim 35, further comprising decreasing the magnitude of the reference voltage in response to a magnitude of current flowing out of the output port falling below a first threshold level.

50. The method of claim 49, further comprising operating the control switching device at a fixed duty cycle in response to a magnitude of current flowing out of the output port falling below a second threshold level, where the second threshold level is lower than the first threshold level.

51. The method of claim 35, further comprising:
generating the signal representing current flowing out of the output port using a current reconstructor subsystem; and
decreasing a size of a dynamically sized field effect transistor of the control switching device when a magnitude of the signal representing current flowing out of the output port falls below a threshold value, thereby increasing a gain of the current reconstructor subsystem.

* * * * *